US011452237B2

(12) United States Patent
Tan et al.

(10) Patent No.: US 11,452,237 B2
(45) Date of Patent: Sep. 20, 2022

(54) LIQUID COOLING INTERCONNECT MODULE OF A COMPUTING SYSTEM

(71) Applicant: Hewlett Packard Enterprise Development LP, Houston, TX (US)

(72) Inventors: Chong S. Tan, Spring, TX (US); Joseph Allen, Tomball, TX (US); Kai Zhang, Taipei (TW)

(73) Assignee: Hewlett Packard Enterprise Development LP, Houston, TX (US)

( * ) Notice: Subject to any disclaimer, the term of this patent is extended or adjusted under 35 U.S.C. 154(b) by 11 days.

(21) Appl. No.: 17/073,090

(22) Filed: Oct. 16, 2020

(65) Prior Publication Data

US 2022/0124942 A1    Apr. 21, 2022

(51) Int. Cl.
*H05K 7/20*    (2006.01)
*F16L 37/30*    (2006.01)
*F16L 37/26*    (2006.01)

(52) U.S. Cl.
CPC .......... *H05K 7/20272* (2013.01); *F16L 37/26* (2013.01); *F16L 37/30* (2013.01); *H05K 7/20772* (2013.01)

(58) Field of Classification Search
None
See application file for complete search history.

(56) References Cited

U.S. PATENT DOCUMENTS

| | | | |
|---|---|---|---|
| 4,611,831 A | 9/1986 | Truchet | |
| 9,351,428 B2 | 5/2016 | Eckberg et al. | |
| 9,943,016 B2 * | 4/2018 | Pietrantonio | H05K 7/20927 |
| 10,164,373 B1 | 12/2018 | Cheon et al. | |
| 10,188,016 B2 | 1/2019 | Lunsman et al. | |
| 10,405,458 B2 | 9/2019 | Fukunaga | |
| 10,701,838 B1 * | 6/2020 | Conroy | H05K 7/20781 |
| 10,734,760 B2 | 8/2020 | Franz et al. | |
| 10,791,654 B2 * | 9/2020 | McCordic | H01Q 21/0025 |
| 11,064,628 B2 * | 7/2021 | Thibaut | H01R 13/631 |
| 11,129,305 B2 * | 9/2021 | Raeth | H05K 7/20409 |
| 2017/0257980 A1 * | 9/2017 | Fukunaga | H01R 13/005 |
| 2019/0141862 A1 * | 5/2019 | Shelnutt | H05K 7/20763 |
| 2020/0163257 A1 * | 5/2020 | Franz | H05K 7/20836 |
| 2021/0385978 A1 * | 12/2021 | Shao | H05K 7/20781 |

* cited by examiner

*Primary Examiner* — Courtney L Smith
(74) *Attorney, Agent, or Firm* — Hewlett Packard Enterprise Patent Department

(57) ABSTRACT

Example implementations relate to a liquid cooling interconnect module of a computing system, and a tool-less method of assembling the liquid cooling interconnect module having a housing, a biasing member, and an interconnect block. The housing has an interlocking member, a support assembly, and a bore extending between a first end and a second end of the housing. The biasing member is disposed within the bore such that it contacts the support assembly. The interconnect block having a pair of through openings, is configured to be slidably inserted within the bore such that it contacts the biasing member. Further, the interconnect block is configured to compress the biasing member against the support assembly to a compressed position when the interconnect block is inserted into the bore, and the interlocking member is configured to retain the interconnect block within the housing when the biasing member is in the compressed position.

18 Claims, 10 Drawing Sheets

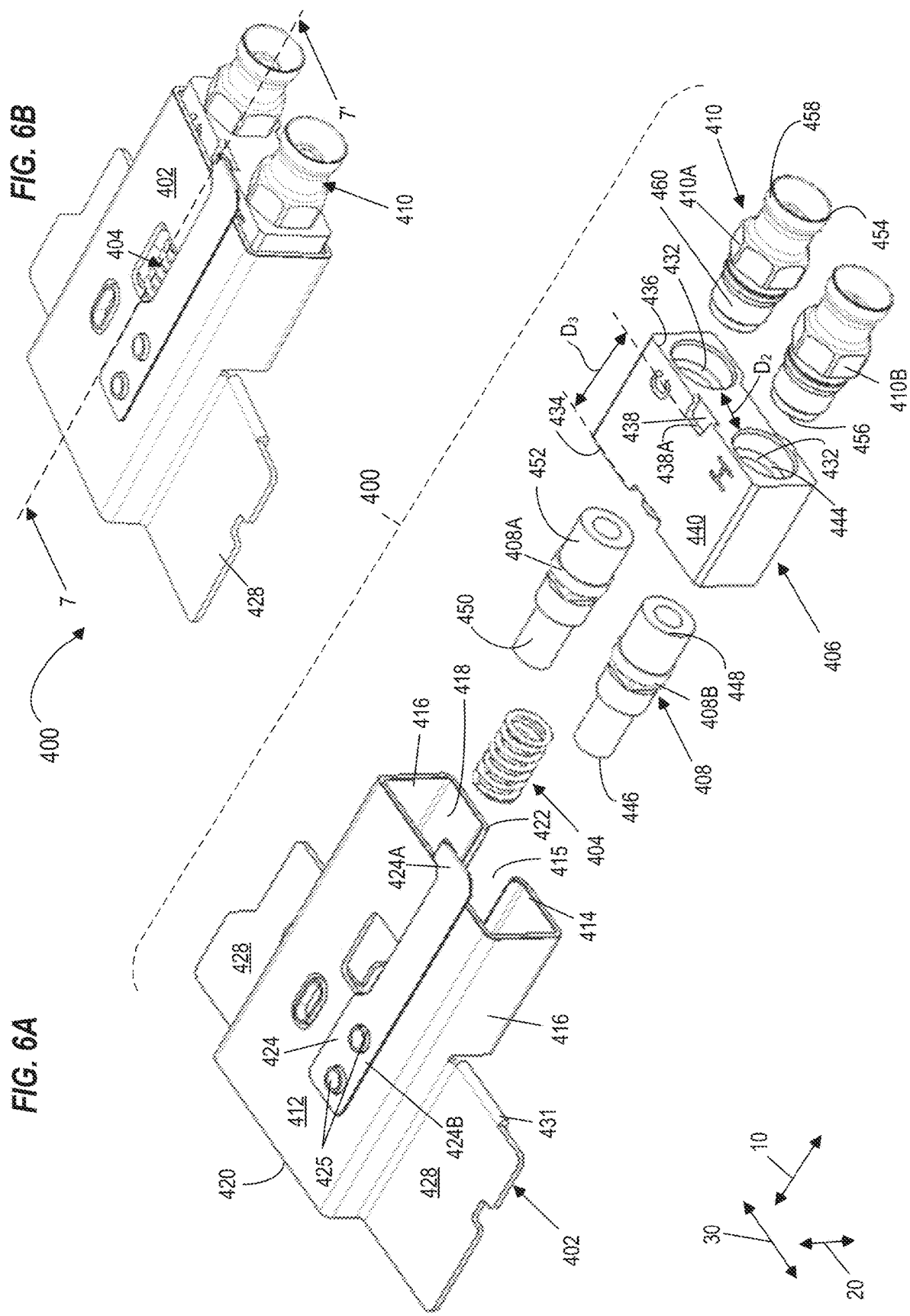

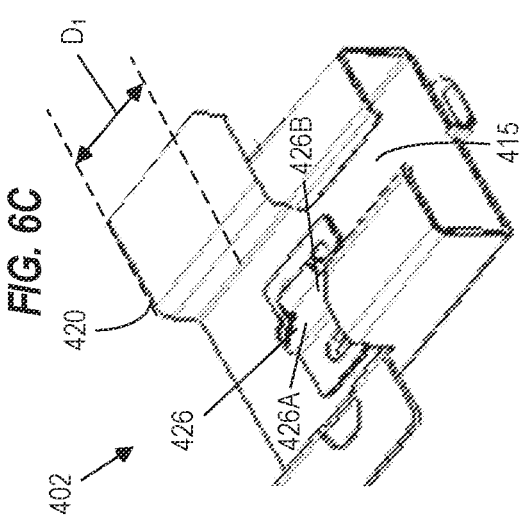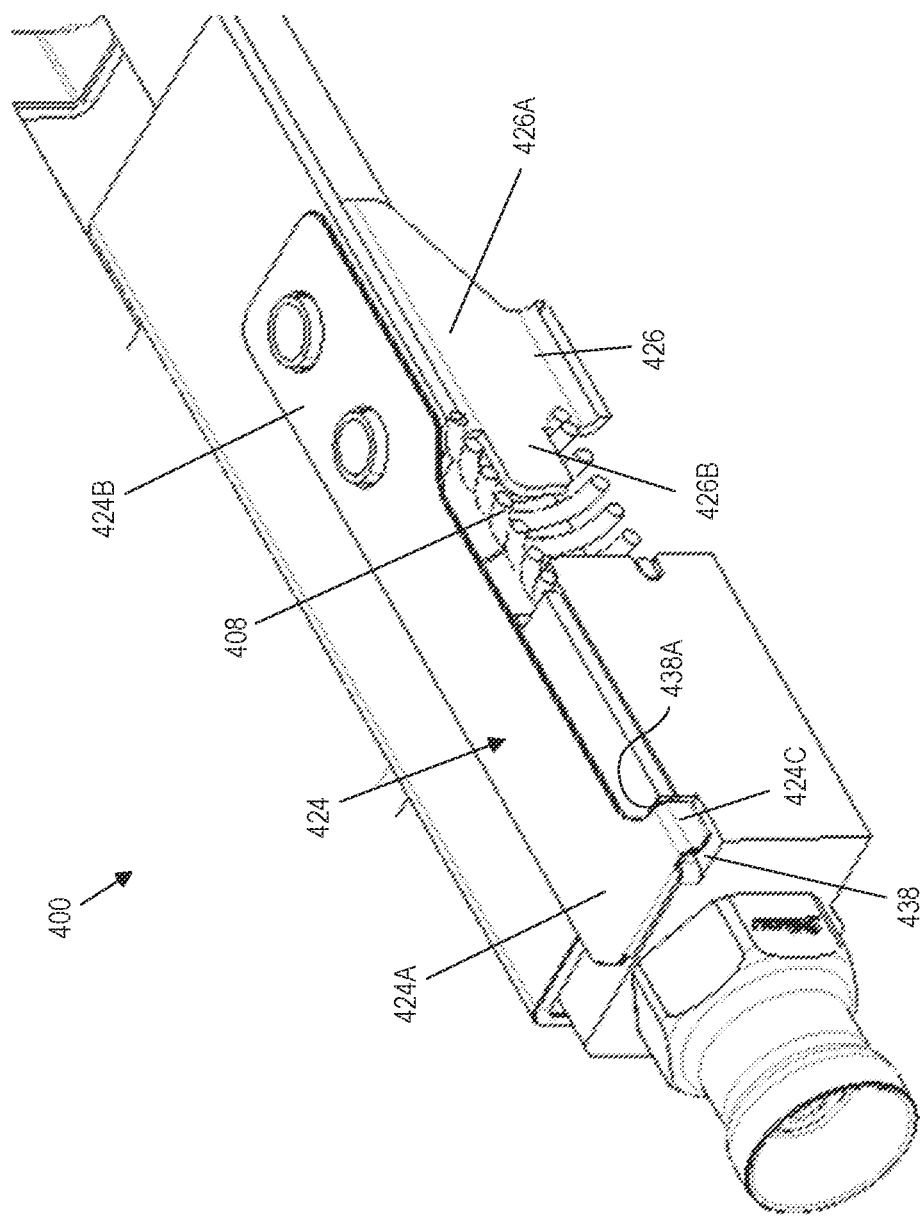

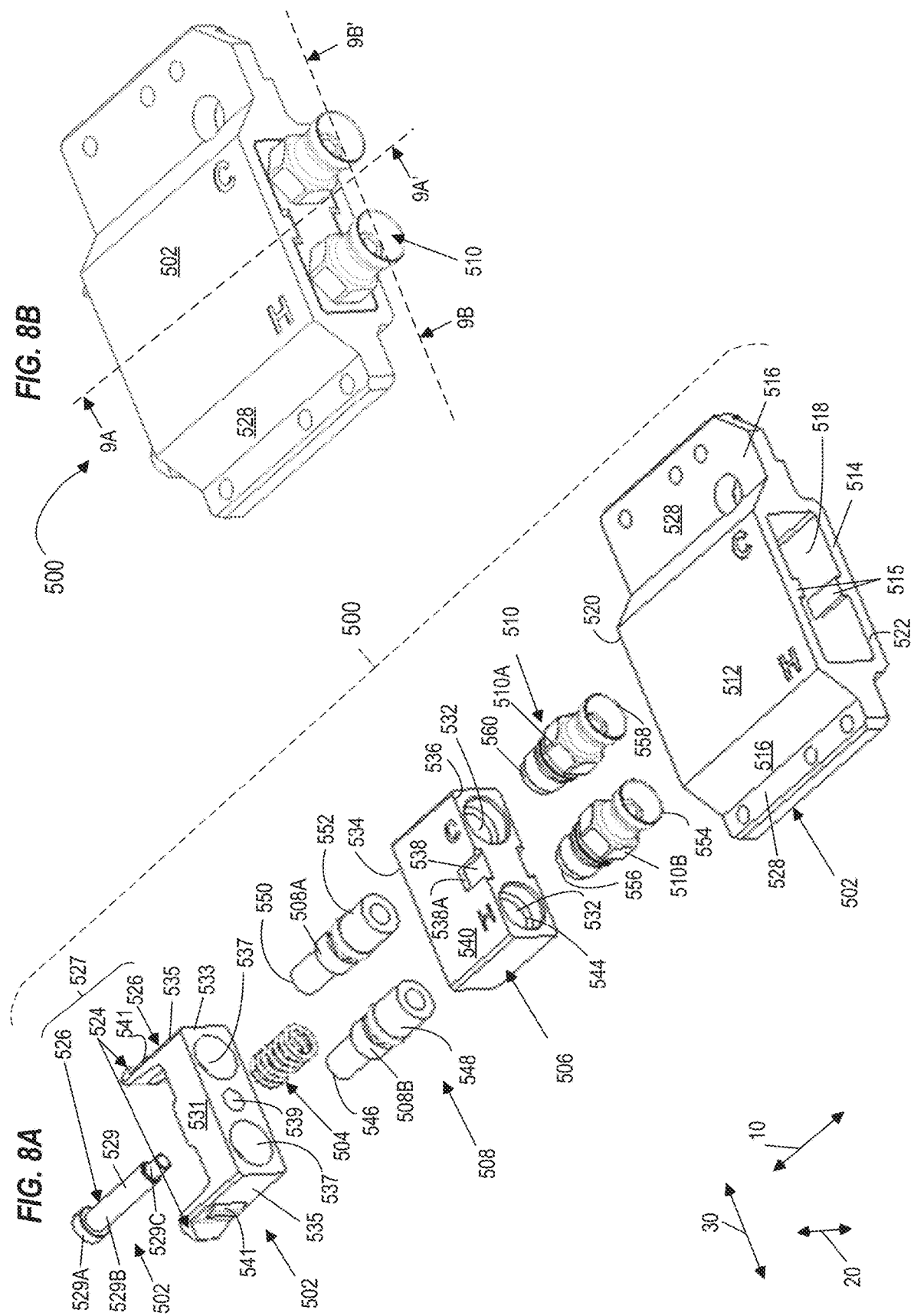

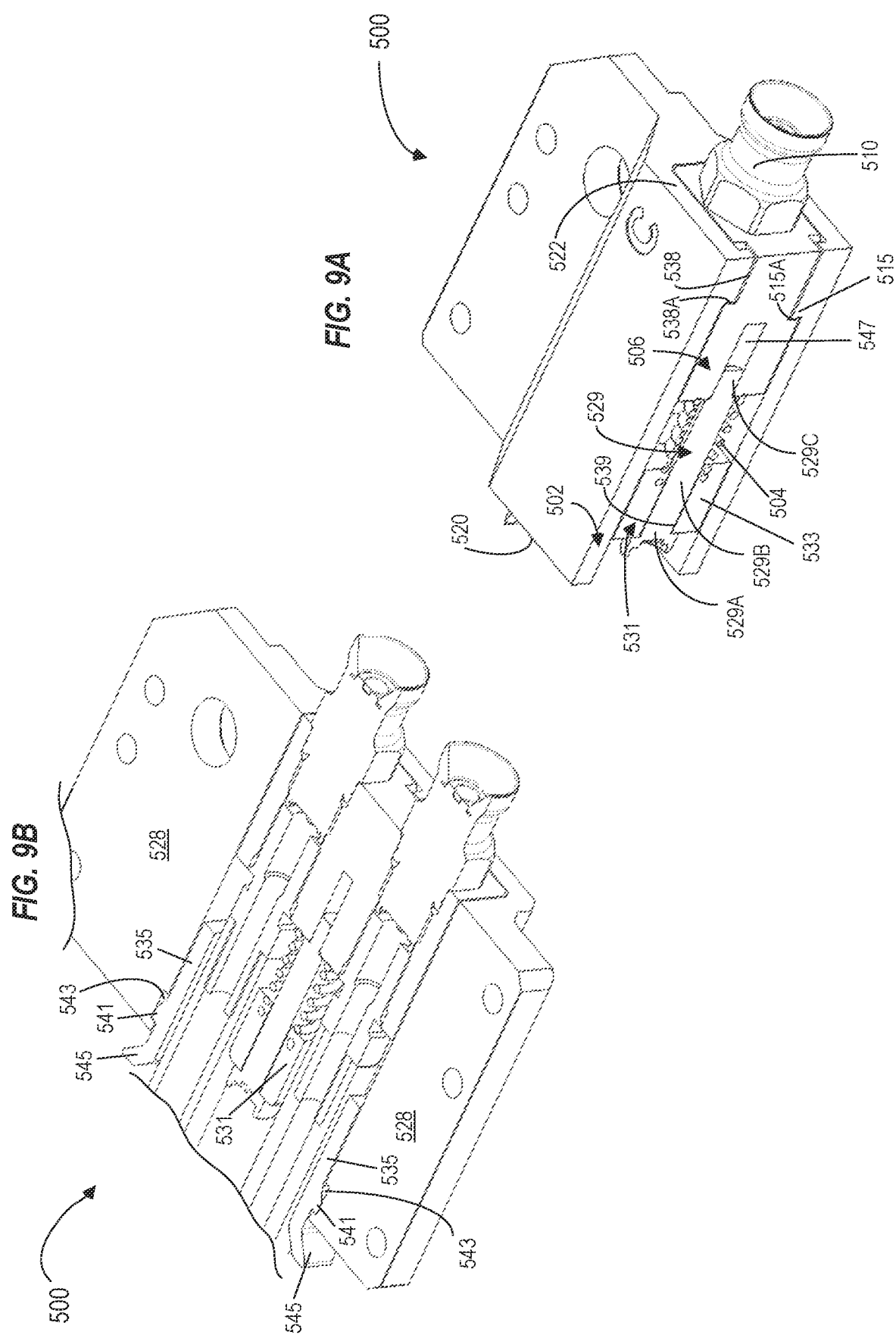

LIQUID COOLING INTERCONNECT MODULE OF A COMPUTING SYSTEM

BACKGROUND

Data center or computing systems in the data center, typically generate large amounts of a waste-heat. Generally, an air cooling system having fans is configured to circulate air for cooling the computing system or components of the computing system. Because of the increasing density of the computing system components, the waste-heat generated by the computing system is also increased. If adequate amount of the waste-heat is not dissipated from the computing system, it may exceed thermal specifications of the computing system components, and thereby degrade the performance, reliability, life expectancy of the components, and may also cause its failure. Therefore, the data center or the computing systems in the data center may use liquids (i.e., liquid coolant) as a heat transfer medium instead of, or in addition to, air for cooling the computing system or the computing system components.

BRIEF DESCRIPTION OF THE DRAWINGS

Various examples will be described below with reference to the following figures.

FIG. 6A illustrates an exploded perspective view of a liquid cooling interconnect module according to another example implementation of the present disclosure.

FIG. 6B illustrates an assembled perspective view of the liquid cooling interconnect module of FIG. 6A according to other example implementation of the present disclosure.

FIG. 6C illustrates a bottom view of a housing of the liquid cooling interconnect module of FIGS. 6A and 6B according to other example implementation of the present disclosure.

FIG. 7 illustrates a cross-sectional view of the interconnect module taken along line 7-7' in FIG. 6B according to other example implementation of the present disclosure.

FIG. 8A illustrates an exploded perspective view of a liquid cooling interconnect module according to yet another example implementation of the present disclosure.

FIG. 8B illustrates an assembled perspective view of the liquid cooling interconnect module of FIG. 8A according to yet other example implementation of the present disclosure.

FIG. 9A illustrates a cross-sectional view of the interconnect module taken along line 9A-9A' in FIG. 8B according to yet other example implementation of the present disclosure.

FIG. 9B illustrates a cross-sectional view of the interconnect module taken along line 9B-9B' in FIG. 8B according to yet other example implementation of the present disclosure.

DETAILED DESCRIPTION

Figure 1:
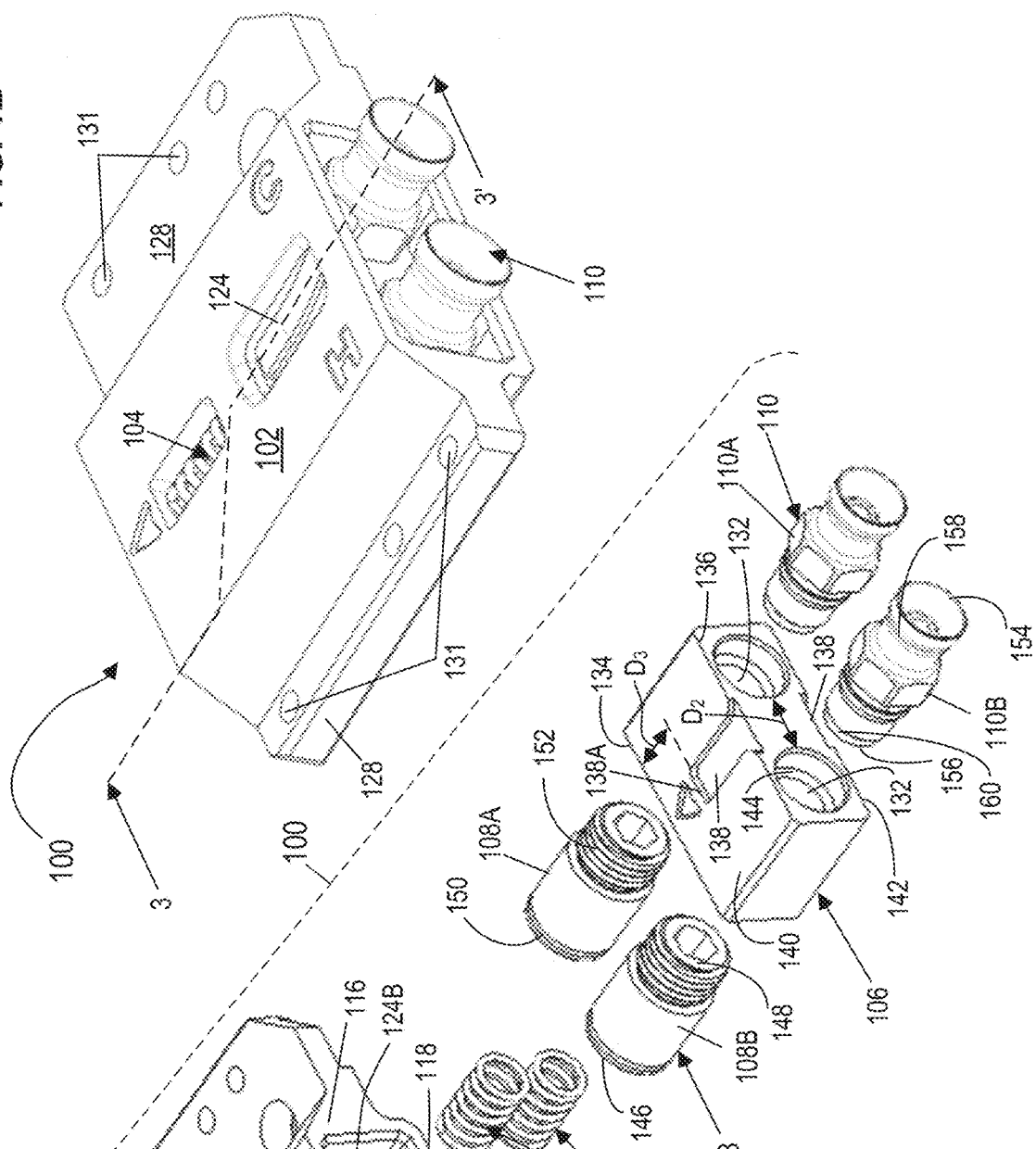
FIG. 1A illustrates an exploded perspective view of a liquid cooling interconnect module according to an example implementation of the present disclosure.
FIG. 1B illustrates an assembled perspective view of the liquid cooling interconnect module of FIG. 1A according to an example implementation of the present disclosure.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing example embodiments only and is not intended to be limiting. As used herein, the singular forms "a," "an," and "the" are intended to include the plural forms as well, unless the context clearly indicates otherwise. The term "plurality," as used herein, is defined as two, or more than two. The term "another," as used herein, is defined as at least a second or more. The term "coupled," as used herein, is defined as connected, whether directly without any intervening elements or indirectly with at least one intervening elements, unless otherwise indicated. Two elements may be coupled mechanically, electrically, or communicatively linked through a communication channel, pathway, network, or system. The term "and/or" as used herein refers to and encompasses any and all possible combinations of one or more of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on. As used herein, the term "detent" may refer to a type of an interlocking mechanism of a component, which engages with another component to restrict a motion of the other component until the interlocking mechanism is released to allow the movement of the other component. As used herein, the term "flat spring finger" may refer to a type of interlocking mechanism of the component, which gets locked in a bent position and then snaps to a straight position to get unlocked. As used herein, the term "interlock" may refer to type of a locking technique that connects a component to another component so that the motion or operation of any part in the other component is constrained by the component. As used herein, the term "biasing member" may refer to a type of a flexible component, which may be compressed/elongated by applying a force, held in a compressed/elongated position, and restored to an original position from the compressed/elongated position upon release of the applied force. For example, the biasing member may be a spring, a diaphragm, and the like. The term "connector" may refer to a type of a mechanical coupler, which fluidically connects/couples two or more flow channels. As used herein the term "tool-less" design may refer to a type of design in a plurality of components that allows an assembly (or disassembly) of the components to form an assembled component, without the need of any tools.

The present disclosure describes example implementations of a liquid cooling interconnect module for a liquid cooling assembly of a computing system. For example, the interconnect module is provided to have a tool-less design to quickly assemble/disassemble by a technician or a customer. It may be noted herein that the term "liquid cooling interconnect module" and "interconnect module" may be used interchangeably. Further, the interconnect module may be coupled to a customized mezzanine frame of the computing system and a fluid flow channel extending via one or more cold plates, to form a liquid cooling assembly. In such examples, the liquid cooling assembly may be provided as a "one stop liquid cooling solution kit" to customers to easily install and/or quickly replace an air cooling assembly of the computing system with the one stop liquid cooling solution kit. In one or more examples, the interconnect module may have an interconnect block, which functions as a mechanical coupling component to connect a fluid flow channel, a supply line, and a return line. In some examples, the fluid flow channel is configured to circulate a liquid coolant in a thermal contact with electronic components of the computing system, and the supply and return lines are configured to distribute the liquid coolant from a coolant distribution unit. In such examples, the interconnect module may be slidably inserted within a bore of a housing such that it may compress a biasing member disposed within the housing into a compressed position, and an interlocking member of the housing may retain the interconnect block within the housing when the biasing member is in the compressed position.

Figure 10:
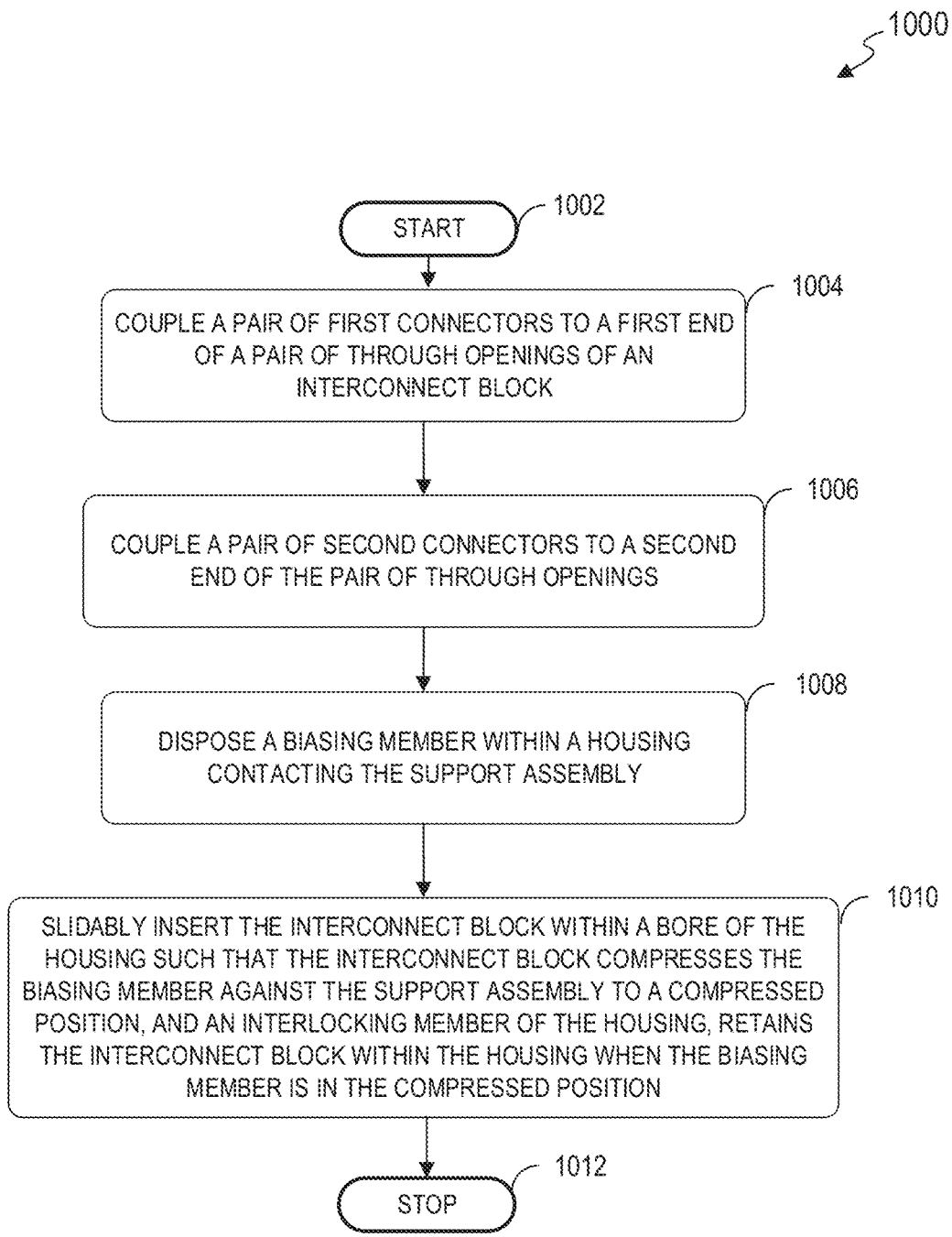
FIG. 10 illustrates a flowchart depicting a method of assembling a liquid cooling interconnect module according to an example implementation of the present disclosure.

For purposes of explanation, certain examples are described with reference to the components illustrated in FIGS. 1-10. The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Further, the sequence of operations described in connection with FIG. 10 is an example and is not intended to be limiting. Additional or fewer operations or combinations of operations may be used or may vary without departing from the scope of the disclosed examples. Thus, the present disclosure merely sets forth possible examples of implementations, and many variations and modifications may be made to the described examples. Such modifications and variations are intended to be included within the scope of this disclosure and protected by the following claims.

Data center or computing systems in the data center, typically generate large amounts of a waste-heat. For example, an electronic printed circuit board (PCB), such as those used in the computing system, commonly have a board with electronic components mounted thereon. The electronic components may generate a considerable amount of a waste-heat due to electrical power consumption. Generally, the waste-heat may need to be dissipated from the electronic components and/or the board to ensure proper functioning of the electronic components and to prevent damage to any part of the PCB and the overall computing system.

A variety of techniques have been developed to dissipate the waste-heat. For instance, one low-cost technique simply allows a heat source (i.e., the electronic components and/or the board) to transfer the waste-heat by convection to ambient air. However, this technique has a relatively low effectiveness. To enhance the effectiveness of dissipation of the waste-heat by convection, other techniques, such as an air cooling mechanism having fans may be used, which may force air to flow over the electronic components and the board. In such examples, a heat sink or a heat spreader may be attached to the electronic components to further enhance the heat dissipation by conducting the waste-heat away from the heat source to the heat sink, from which the waste-heat may be dissipated to the air. Further, to enhance the effectiveness of dissipation of the waste-heat, the air cooling mechanism may have to be operated at higher air flow rates, provide cooler air, or both to adequately cool the electronic components. However, operating the fans to provide the air at the higher flow rates may result in consuming greater quantity of power. Similarly, cooling the air to a temperature below the ambient temperature using a refrigeration system, may consume greater quantity of power.

Therefore, for greater heat dissipation of the waste-heat, without consuming greater quantity of power, an increasingly sophisticated technique, including "liquid loop" concepts involving the use of a liquid coolant in a cold plate has been developed. Because, the liquid coolant has a much higher heat carrying capacity than air, it may be considered as an alternative solution for dissipation of the waste-heat. However, using the liquid coolant as the heat transfer medium may require a substantial modification to an existing cooling solution of the computing system. For example, the computing system may need to include a liquid interconnect module to connect supply and return lines of the coolant distribution unit to a fluid flow channel for circulating the liquid coolant in thermal contact with the electronic components of the computing system. Further, assembling and/or disassembling the liquid interconnect module, i.e., by way of connecting a plurality of connectors to the liquid interconnect module, and/or connecting the supply and return lines, or the fluid flow channel to the plurality of connectors may require appropriate tools, and requires technicians to follow a complicated process to complete the assembly and/or disassembly process. Thus, during a service or installation event, the technicians or customers may handily require the appropriate tools, for example, a screw driver, and the like to remove screws for attaching/detaching the supply and the return lines, the fluid flow channel, and the connectors to the interconnect module. Further, whenever the customers want to switch from the air cooling mechanism to the liquid cooling mechanism, the customer or the technician may have to modify and replace one or more air cooling components, for example, the heat sinks, fans, and the like of the computing system, as those components are not compatible with a kind of cooling components, that are required for the liquid cooling assembly. In such examples, any loss of components belonging to the liquid cooling interconnect module, such as screws, or timely non-availability of the appropriate tools may result in associated downtime of the computing system until the time those components are replaced or tools are made available. Further, the components belonging to the liquid cooling interconnect module, which may require tools for assembly/disassembly may be difficult for bulk manufacturing and are not economically viable.

A technical solution to the aforementioned issues may include implementing a plurality of components of a liquid cooling interconnect module, to have a tool-less design for enabling quick and easy assembly of those components to form the assembled liquid cooling interconnect module. Further, another technical solution may include enabling installation of such assembled interconnect module in a computing system as part of a liquid cooling assembly, for providing a liquid cooling solution to dissipate a waste-heat from the computing system. In some examples, the plurality of components of the interconnect module may include a housing, a biasing member, an interconnect block, and a plurality of first connectors. In such examples, the plurality of components may have one or more features, which enables those components to be easily assembled without the need for any tools to form the liquid cooling interconnect module. Further, the liquid cooling interconnect module may be coupled to a mezzanine frame of the computing system, and the fluid flow channel extending via a plurality of cold plates, may be coupled to the liquid cooling interconnect module, to form the liquid cooling assembly. In some examples, the liquid cooling assembly may be offered as one stop liquid cooling solution to customers, which may be used as a replacement assembly for an air cooling assembly of the computing system.

Accordingly, in one or more examples of the present disclosure the liquid cooling interconnect module includes the housing, the biasing member, and the interconnect block. The housing has an interlocking member, a support assembly, and a bore that extends between a first end and a second end of the housing. The biasing member is disposed within the bore of the housing such that it contacts the support assembly. The interconnect block has a pair of through openings, is configured to be slidably inserted within the bore of the housing such that it also contacts the biasing member. In such examples, the interconnect block is configured to compress the biasing member against the support assembly to a compressed position when the interconnect block is inserted into the bore of the housing, and the interlocking member of the housing is configured to retain the interconnect block within the housing when the biasing member is in the compressed position.

Figure 2:
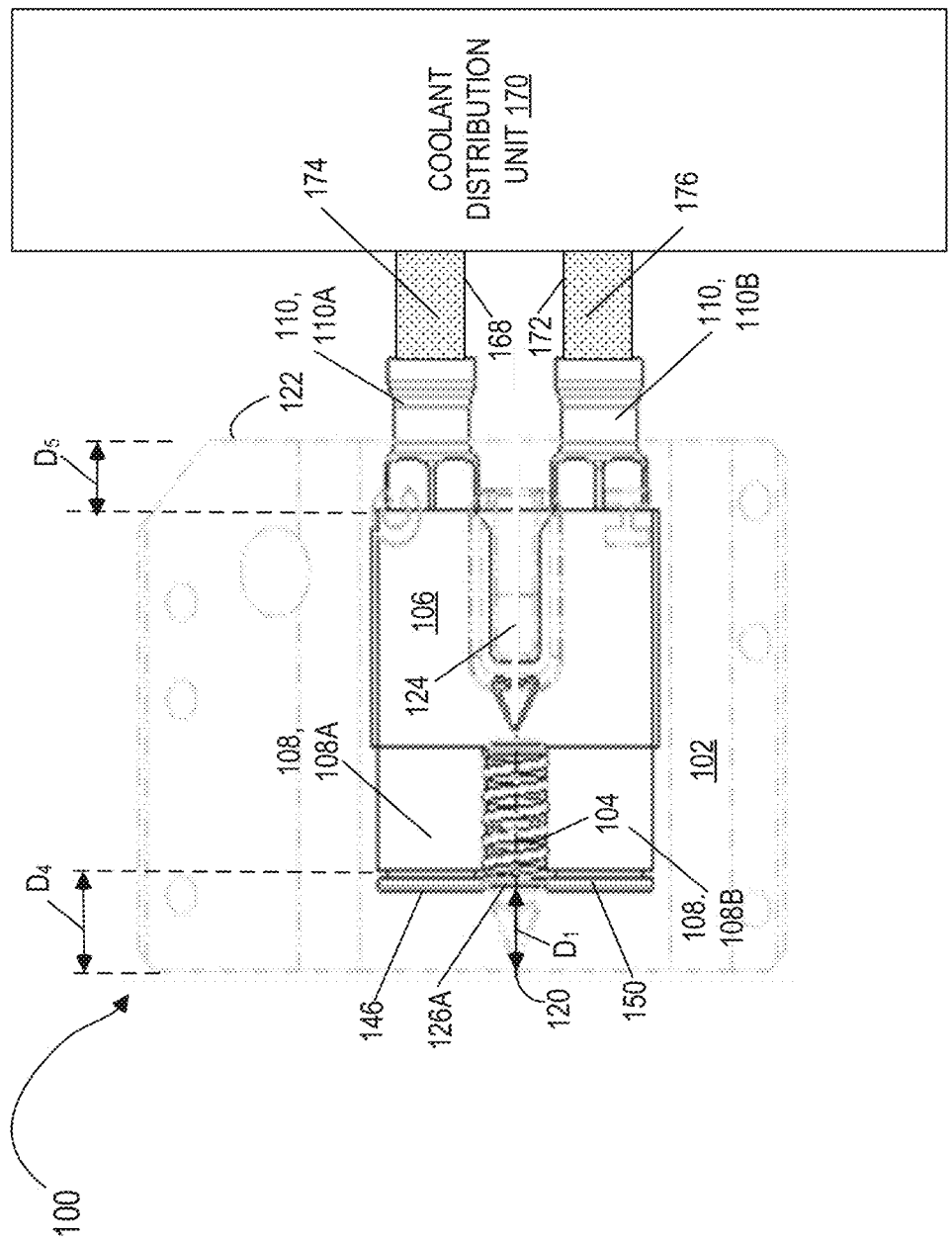
FIG. 2 illustrates a top view of the liquid cooling interconnect module of FIG. 1B and a coolant distribution unit according to an example implementation of the present disclosure.

FIG. 1A depicts an exploded perspective view of a liquid cooling interconnect module 100. FIG. 1B depicts an assembled perspective view of the liquid cooling interconnect module 100 of FIG. 1A. FIG. 2 depicts a top view of the assembled liquid cooling interconnect module 100 and a coolant distribution unit 170. In some examples, the liquid cooling interconnect module 100 is a mechanical coupler, which may be coupled to a support structure, for example, a mezzanine frame of a computing system to provide interconnection of two or more cooling fluid conduits within the computing system. In one or more examples, the two or more cooling fluid conduits may circulate a liquid coolant from a coolant distribution unit to the computing system for dissipating a waste-heat from the computing system. In the example of FIGS. 1A and 1B, the liquid cooling interconnect module 100 includes a housing 102, a pair of biasing members 104, an interconnect block 106, a first pair of connectors 108, and a second pair of connectors 110.

The housing 102 may be a box-shaped component, for example. In some examples, the housing 102 includes a first wall 112, a second wall 114, and a pair of peripheral walls 116 (e.g., sidewalls) extending between the first and second walls 112, 114, respectively to define the box-shaped component. The first wall 112 and the second wall 114 are mutually opposite walls, for example, a top cover wall and a bottom cover wall, respectively. Further, the housing 102 includes a bore 118 defined in-between the pair of peripheral walls 116 and the first and second walls 112, 114 and extending between a first end 120 and a second end 122 of the housing 102. The housing 102 further includes a pair of interlocking members 124, a support assembly 126, and a pair of flanges 128.

The pair of interlocking members 124 is formed on the first wall 112 and the second wall 114 of the housing 102. In the example of FIGS. 1A and 1B, the pair of interlocking members 124 is a pair of detents. In some other examples, the pair of interlocking members 124 may a separate component, which may be coupled to the first and second walls 112, 114, respectively. In such examples, each of the first and second walls 112, 114 may have a through opening to enable a respective interlocking member 124 to be coupled to the corresponding wall of the first and second walls 112, 114. Each detent among the pair of detents 124 is formed around a recess 130 such that they are cantilevered (e.g., having a first free end 124A and a second fixed end 124B). In some examples, the first free end 124A may include a protrusion 124C (shown in FIG. 3) extending inwards relative to the housing 102.

The support assembly 126 is used to support the biasing member 104. In some examples, the support assembly 126 includes a post 126A disposed inside the bore 118 at an offset distance "$D_1$" (shown in FIG. 2) from the first end 120 of the housing 102, and a pair of guide pins 126B (one guide pin is shown in FIG. 1A) extending perpendicularly from the post 126A. In some examples, each guide pin of the pair of guide pins 126B extends a longitudinal direction 10. Further, the pair of guide pins 126B may be spaced apart from one another along a radial direction 20. In some examples, each guide pin of the pair of guide pins 126B is configured to retain a corresponding biasing member of the pair of biasing members 104 within the housing 102. Similarly, the post 126A is configured to block the movement of each biasing member 104 along the longitudinal direction 10 so as to allow the compression of the corresponding biasing member 104. In some non-limiting examples, the support assembly 126 may have one guide pin 126B extending from the post 126A without deviating from the scope of the present disclosure. In some examples, the post 126A may be a wall disposed along the radial direction 20 and coupled to the first and second walls 112, 114, respectively of the housing 102.

The pair of flanges 128 extends from the pair of peripheral walls 116 of the housing 102 along a lateral direction 30. In some examples, the pair of peripheral walls 116, and the pair of flanges 128 may be merged (or integrated) to one another to form a unitary flange component. In such examples, the first wall 112 and the second wall 114 may also be integrated to the unitary flange component to form a unitary housing component. Each flange of the pair of flanges 128 may have through-holes 131 to accommodate fasteners to couple the liquid cooling interconnect module 100 to the support structure, for example, the mezzanine frame of the computing system. In the example of FIGS. 1A and 1B, each flange of the pair of flanges 128 has a different width to adapt to a size of the support structure of the computing system.

In the example of FIGS. 1A and 1B, each biasing member of the pair of biasing members 104 is a helical compression spring. In some other examples, each biasing member 104 may be diaphragm, and the like. The pair of biasing members 104 are spaced apart from one another along the radial direction 20. For example, the radial distance in-between the pair of biasing members 104 may be substantially equal to the radial distance in-between the pair of guide pins 126B. Further, in some non-limiting examples, the liquid cooling interconnect module 100 may have only one biasing member 104 without deviating from the scope of the present disclosure. However, the liquid cooling interconnect module 100 having the pair of biasing members 104 may apply adequate pulling force on the pair of first connectors 108 and a fluid flow channel 164 (shown in FIG. 4) connected to the pair of first connectors 108, so as to secure those components to the housing 102 and also provide adequate plunging force so as to push the interconnect block 106 outside the housing 102, when the interconnect block 106 is not retained by the interlocking member 124 of the housing 102.

The interconnect block 106 may also be a box-shaped component, for example. In some examples, the interconnect block 106 has an outer profile/dimension, which may be substantially complementary to an inner profile/dimension of the housing 102 or to the dimension of the bore 118. In one or more examples, the interconnect block 106 includes a pair of through openings 132 extending along the longitudinal direction 10. In such examples, the pair of through openings 132 are positioned spaced apart from one another by a distance "$D_2$" along the lateral direction 30, and extends between a first end 134 and a second end 136 of the interconnect block 106. In some examples, the distance "$D_2$" may be substantially equal to a width of the post 126A or each biasing member 104, such that the pair of biasing members 104 and/or the post 126A does not interfere with the pair of through openings 132. The interconnect block 106 further includes a pair of depressions 138 formed on a first wall 140 and a second wall 142 of the interconnect block 106. As discussed herein above, the first wall 140 and the second wall 142 are mutually opposite walls, for example, a top wall and a bottom wall, respectively. For example, each depression of the pair of depressions 138 is formed on a portion of the first and second walls 140, 142, respectively such that each depression extends from the second end 136 till an offset distance "$D_3$" from the first end 134 of the interconnect block 106. In some examples, a length of each depression 138 may be substantially equal to a three fourth of a length of the interconnect block 106. In such examples, each depression 138 may end up having a lobe 138A at the offset distance "$D_3$" from the first end 134, which has a height that is substantially equal to a height of each depression 138. In some examples, each through opening 132 of the interconnect block 106, includes female screw threads 144 at the first end and second ends 134, 136 of the interconnect block 106.

In some non-limiting examples, the pair of biasing members 104 may be coupled (i.e., fixed/attached) to the first end 134 of the interconnect block 106 such that the pair of biasing members 104 extends outwards along the longitudinal direction 10 from a portion of the interconnect block 106, located between the pair of through openings 132. In some other non-limiting examples, the pair of biasing members 104 may be merged (or integrated) to the first end of the interconnect block 106 to form a biasing interconnect block. In all such examples, the support assembly 126 of the housing 102 may not require to have the pair of guide pins 126B to retain the pair of biasing members 104 in the housing 102.

In some examples, the pair of first connectors 108 (or liquid couplings) may be hose barb connectors, clamped hose connectors, dry disconnect liquid connectors, blind mate liquid connectors, barbed fitting connectors, push fitting connectors, threaded fitting connectors, and the like. In the example of FIGS. 1A and 1B, the pair of first connectors 108 includes a first connector 108A and a second connector 108B, where each of the first and second connectors 108A, 108B has a first end portion 146 and a second end portion 148. In such examples, the first end portion 146 has a push connect feature 150 and the second end portion 148 has male screw threads 152, for example.

As discussed hereinabove, the pair of second connectors 110 (or liquid couplings) may also be hose barb connectors, clamped hose connectors, dry disconnect liquid connectors, blind mate liquid connectors, barbed fitting connectors, push fitting connectors, threaded fitting connectors, and the like. In the example of FIGS. 1A and 1B, the pair of second connectors 110 includes a first connector 110A and a second connector 110B, where each of the first and second connectors 110A, 110B has a first end portion 154 and a second end portion 156. In such examples, the first end portion 154 has a push connect feature 158 and the second end portion 156 has male screw threads 160, for example.

In some examples, the plurality of components of the liquid cooling interconnect module 100, such as the housing 102, the interconnect block 106, the pair of first connectors 108, and the pair of second connectors 110 may be made of a polymer material. In some other examples, the plurality of components of the liquid cooling interconnect module 100 may be made of a metal, and the like.

In the example of FIG. 2, the housing 102 is shown in a dotted line, to illustrate the position of other components of the liquid cooling interconnect module 100, for example, the pair of biasing members 104, the interconnect block 106, the pair of first connectors 108, and the pair of second connectors 110. Such an illustration should not be construed to be restrictive. Now referring to examples of FIG. 1B and FIG. 2, the plurality of components of the liquid cooling interconnect module 100 may be easily and quickly assembled or disassembled without any tools. For example, each connector of the pair of first connectors 108 may be first coupled to a respective opening of the pair of through openings 132 at the first end 134 of the interconnect block 106. In particular, the second end portion 148 of the pair of first connectors 108 having the male screw threads 152 may be screw-fitted to the female screw threads 144 at the first end 134 of the interconnect block 106. Similarly, each connector of the pair of second connectors 110 may be coupled to a respective opening of the pair of through openings 132 at the second end 136 of the interconnect block 106. In particular, the first end portion 156 of the pair of second connectors 110 having the male screw threads 160 may be screw-fitted to the female screw threads 144 at the second end 136 of the interconnect block 106.

Later, the fluid flow channel 164 (shown in FIG. 4) may be inserted through the bore 118 of the housing 102, and a first end 164A (shown in FIG. 4) of the fluid flow channel 164 may be push fitted to the first connector 108A of the pair of first connectors 108, and a second end 164B (shown in FIG. 4) of the fluid flow channel 164 may be push fitted to the second connector 108B of the pair of first connectors 108.

Further, the pair of biasing members 104 is disposed within the bore 118 of the housing 102 such that each biasing member of the pair of biasing members 104 is disposed along a corresponding guide pin of the pair of guide pins 126B. In other words, each biasing member 104 passes over the corresponding guide pin 126B such that a first end (not labeled) of each biasing member 104 contacts the post 126A of the support assembly 126. The interconnect block 106 is then slidably inserted within the bore 118 of the housing 102 such that the first end 134 of the interconnect block 106 contacts a second end (not labeled) of each biasing member 104.

The interconnect block 106 is then pushed along the longitudinal direction 10, such that each biasing member 104 is compressed by the interconnect block 106 and the support assembly 126 of the housing 102, until each biasing member 104 reaches to a compressed position. In other words, the interconnect block 106 is configured to compress the biasing member 104 against the support assembly 126 to the compressed position when the interconnected block 106 is inserted into the bore 118 of the housing 102. Once each biasing member 104 reaches to the compressed position, the force applied to push the interconnect block 106 inside the housing 102 may be withdrawn. In such cases, each biasing member 104 may try to decompress, thereby moving the interconnect block 104 outside (backward) the housing 102. However, in such examples, each detent of the pair of detents 124 may move inwards relative to the housing 102 to engage the protrusion 124C of each detent 124 with the lobe 138A of a corresponding depression 138 so as to directly retain the interconnect block 106 within the housing 102 when each biasing member 104 is still in the compressed position. In one or more examples, each detent 124 may move along the radially downwards direction 20 to interlock the backward movement of the interconnect block 106, and thereby retain the interconnect block 106 within the housing 102 and complete a tool-less method of assembling the liquid coolant interconnect module 100. In one or more examples, to disassemble the liquid coolant interconnect module 100, each detent of the pair of detents 124 may have to move outwards relative to the housing 102 to disengage the protrusion 124C from the lobe 138 of the corresponding depression 138 so as to directly release the interconnect block 106 from the housing 102. In such examples, each detent 124 may move along the radially upwards direction 20 to allow the backward movement of the interconnect block 106, and thereby release the interconnect block 106 from the housing 102. It may be noted herein, when the protrusion 124C disengages from the lobe 138A, each biasing member 104 may completely decompress to slidably plunge the interconnect block 106 out of the housing 102.

Referring back to FIG. 2, after assembly of the liquid cooling interconnect module 100, the interconnect block 106 is completely disposed within the housing 102. In particular, the interconnect block 106 is positioned at an offset distance "$D_4$" from the first end 120 of the housing 102 and at an offset distance "$D_5$" from the second end 122 of the housing 102. Similarly, the pair of first connectors 108 is completely disposed within the housing 102, and a portion of the pair of second connectors 110 is partially disposed within the housing 102. In one or more examples, the first connector 110A of the pair of second connectors 110 is further coupled to a supply line manifold 168 of a coolant distribution unit 170, and the second connector of the pair of second connectors 110 is coupled to a return line manifold 172 of the coolant distribution unit 170. In some examples, the coolant distribution unit 170 may be a rack-level liquid cooling system, a row-level liquid cooling system, a datacenter-level liquid cooling system, and the like. In one or more examples, the coolant distribution unit 170 may include a pump (not shown) that is configured to supply a liquid coolant 174 to the computing system via the supply line manifold 168 and the first connector 110A of the pair of first connectors 110, and receive a heated liquid coolant 176 from the computing system via the return line manifold 172 and the second connector 110B of the pair of second connectors 110. In some examples, the coolant distribution system 170 may include a heat exchanger (not illustrated) to remove waste-heat from the heated liquid coolant 176 and regenerate the liquid coolant 174. The process of supplying the liquid coolant 174 and receiving the heated liquid coolant 176 may continue, as discussed herein above.

Figure 3:
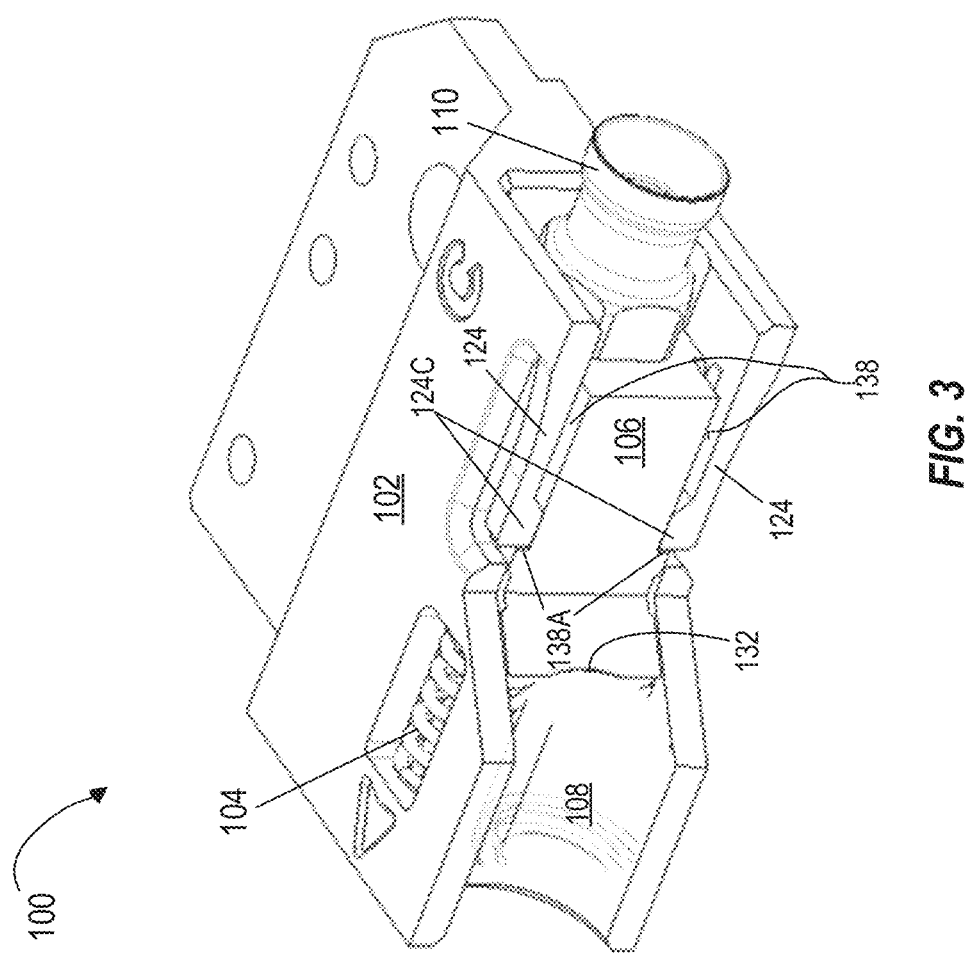
FIG. 3 illustrates a cross-sectional view of the interconnect module taken along line 3-3' in FIG. 1B according to an example implementation of the present disclosure.

FIG. 3 depicts a cross-sectional of the interconnect module 100 taken along line 3-3' in FIG. 1B. In the example of FIG. 3, while assembling the liquid cooling interconnect module 100, the pair of detents 124 interlocks the interconnect block 106 when each biasing member 104 is in the compressed position, so as to restrict the backward movement of the interconnect block 106 by each biasing member 104, in order to push it out of the housing 102. In particular, each detent 124 moves inwards relative to the housing 102, to engage the protrusion 124C of each detent 124 with the lobe 138A of a corresponding depression 138 to directly retain the interconnect block 106 within the housing 102. In some examples, while disassembling the liquid cooling interconnect module 100, the pair of detents 124 may be moved outwards relative to the housing, to disengage the protrusion 124C of each detent 124 from the lobe 138A of the corresponding depression 138 to directly release the interconnect block 106 from the housing 102. In such examples, when the lobe 138A is disengaged from the protrusion 124C, each biasing member 104 may decompress to slidably plunge the interconnect block 106 out of the housing 102. Thus, in accordance to one or more examples of the present disclosure, assembling and/or disassembling the liquid cooling interconnect module 100 may not require any tools and may be performed easily and quickly, thereby reducing the down time and users errors associated to such events. Further, the plurality of components of the liquid interconnect module 100, having relatively simple tool-less design(s) may enable bulk manufacturing and is economically viable.

Figure 4:
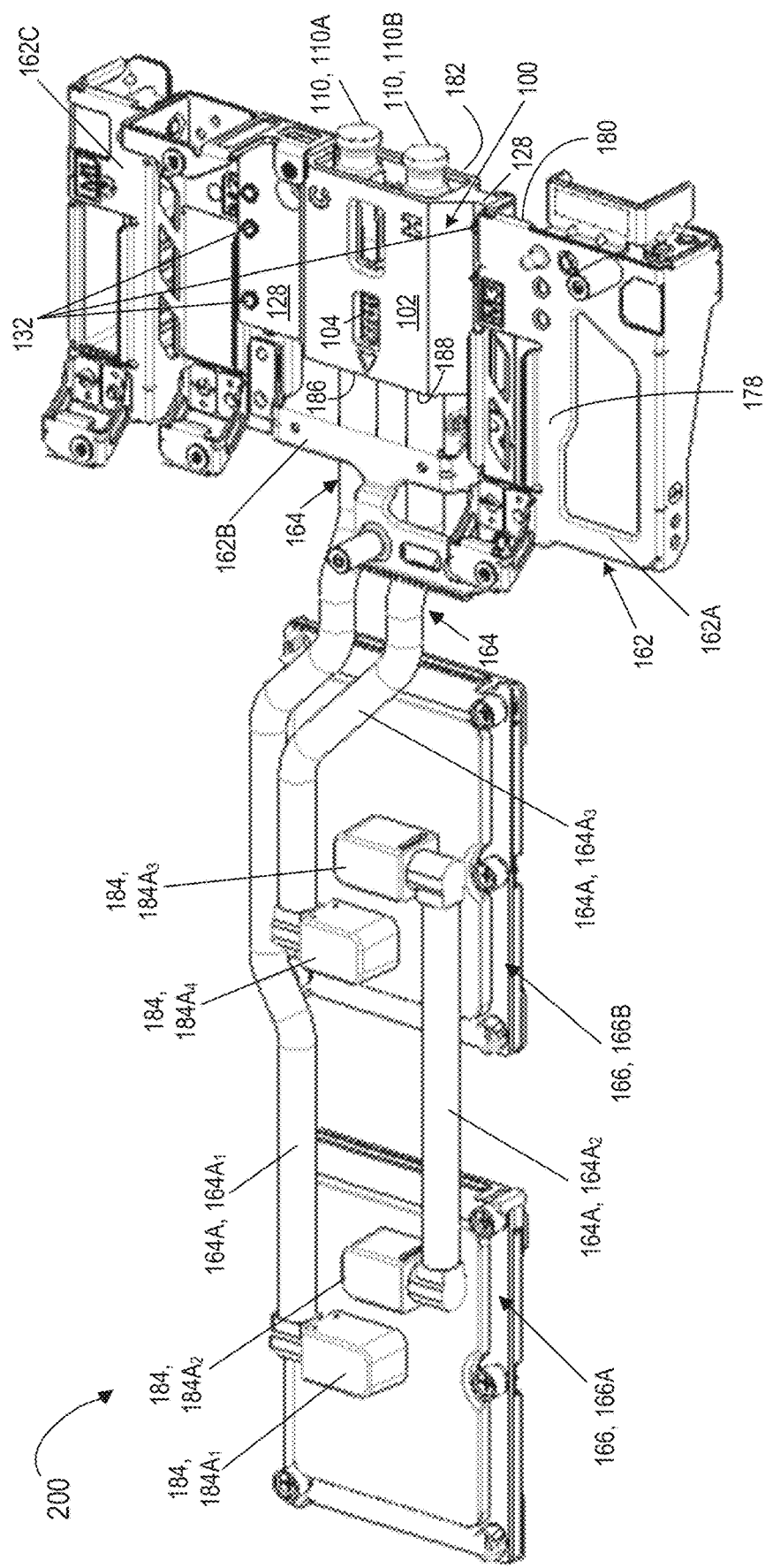
FIG. 4 illustrates a perspective view of the liquid cooling assembly having a liquid cooling interconnect module of FIG. 1B according to an example implementation of the present disclosure.

FIG. 4 depicts a perspective view of a liquid cooling assembly 200 having a liquid cooling interconnect module 100 of FIG. 1B. The liquid cooling assembly 200 may be a one stop liquid cooling solution kit for a computing system, in order to dissipate a waste-heat from a circuit board and/or one or more electronic components mounted on the circuit board of the computing system. In one or more examples, the liquid cooling assembly 200 includes the liquid cooling interconnect module 100, a support structure, for example, a mezzanine frame 162, a fluid flow channel 164, and a plurality of cold plates 166.

The mezzanine frame 162 is made of a plurality of an inverted "U" shaped support components 162A, 162B, 162C that are coupled to one another. In the example of FIG. 4, the mezzanine frame 162 includes three numbers of support components. In such examples, each of the plurality of support components 162A, 162B, 162C has a top surface 178 having provisions for holding a plurality of mezzanine cards (not shown) and a bottom surface 180. In the example of FIG. 4, the bottom surface 180 of a middle mezzanine frame 162B may define a slot 182 to allow plugging of the liquid cooling interconnect module 100 within the mezzanine frame 162. In some examples, the mezzanine frame 162 may be made of a metal, and the like.

The liquid cooling interconnect module 100 may include a housing, a pair of biasing members 104, an interconnect block 106, a pair of first connectors 108, and a pair of second connectors 110, as discussed in the examples of FIGS. 1A and 1B. As discussed hereinabove, the liquid cooling interconnect module 100 may be disposed in the slot 182 and coupled to the mezzanine frame 162. For example, a pair of flanges 128 of the housing 102 may be coupled to mezzanine frame 162. For example, each flange of the plurality of flanges 128 has a plurality of through-holes 131 to accommodate fasteners to couple the liquid cooling interconnect module 100 to the mezzanine frame 162. In the example of FIG. 4, the pair of first connectors 108 of the liquid cooling interconnect module 100 may be disposed facing an interior of the computing system (shown in FIG. 5) and the plurality of second connectors 110 of the liquid cooling interconnect module 100 may be disposed facing the exterior of the computing system (shown in FIG. 5). As discussed in the example of FIG. 2, a first connector 110A of the pair of second connectors 110 may be coupled to a supply line manifold of a coolant distribution unit, and the second connector 110B of the pair of second connectors 110 may be coupled to a return line manifold of the coolant distribution unit.

The fluid flow channel 164 extends via the plurality of cold plates 166. In some examples, the fluid flow channel 164 is a flexible conduit, which may be made of a polymer material, and the like. In the example of FIG. 4, the fluid flow channel 164 is made of a plurality of discrete channels 164A. In one or more examples, the plurality of discrete channels 164A may be coupled to one another via the plurality of cold plates 166 and a plurality of pluggable connectors 184. In the example of FIG. 4, the fluid flow channel 164 has three numbers of discrete channels 164A and four numbers of pluggable connectors 184. In some examples, each of the plurality of pluggable modules 184 may be connected to the respective cold plate of the plurality of cold plates 166. For example, a first inlet pluggable connector 184A$_1$ and a first outlet pluggable connector 184A$_4$ may be coupled to a first cold plate 166A of the plurality of cold plates 166. Similarly, a second inlet pluggable connector 184A$_3$ and a second outlet pluggable connector 184A$_4$ may be coupled to a second cold plate 166B of the plurality of cold plates 166. In some examples, a first connector 108A of the pair of first connectors 108 (shown in FIGS. 1B, 2, and 3) is coupled to a first end 186 of the fluid flow channel 164, and a second connector 108B of the pair of first connectors 108 is coupled to a second end 188 of the fluid flow channel 164. In particular, a first discrete channel 164A$_1$ may be coupled to the first connector 108A and the first inlet pluggable module 184A$_1$, an intermediate discrete channel 164A$_2$ may be coupled to the first outlet pluggable connector 184A$_2$ and the second inlet pluggable connector 184A$_3$, and the third discrete channel 164A$_3$ may be coupled to the second outlet pluggable connector 184A$_4$ and the second connector 108B.

The plurality of cold plates 166 may be disposed in a plurality of processing resource (not shown) of the computing system, such that each cold plate is in thermal communication with a corresponding processing resource. For example, the first cold plate 166A is mounted on a first processing resource of the computing system, and the second cold plates 166B is mounted on a second processing resource of the computing system. Each of the plurality of cold plates 166 may include internal flow channels to direct the liquid coolant from inlet pluggable connector to the outlet pluggable connector. Thus, in accordance to one or more examples of the present disclosure the liquid cooling assembly 200 may be provided as a "one stop liquid cooling solution kit" to customers to easily install and/or quickly replace an air cooling assembly of the computing system with the one stop liquid cooling solution kit.

Figure 5:
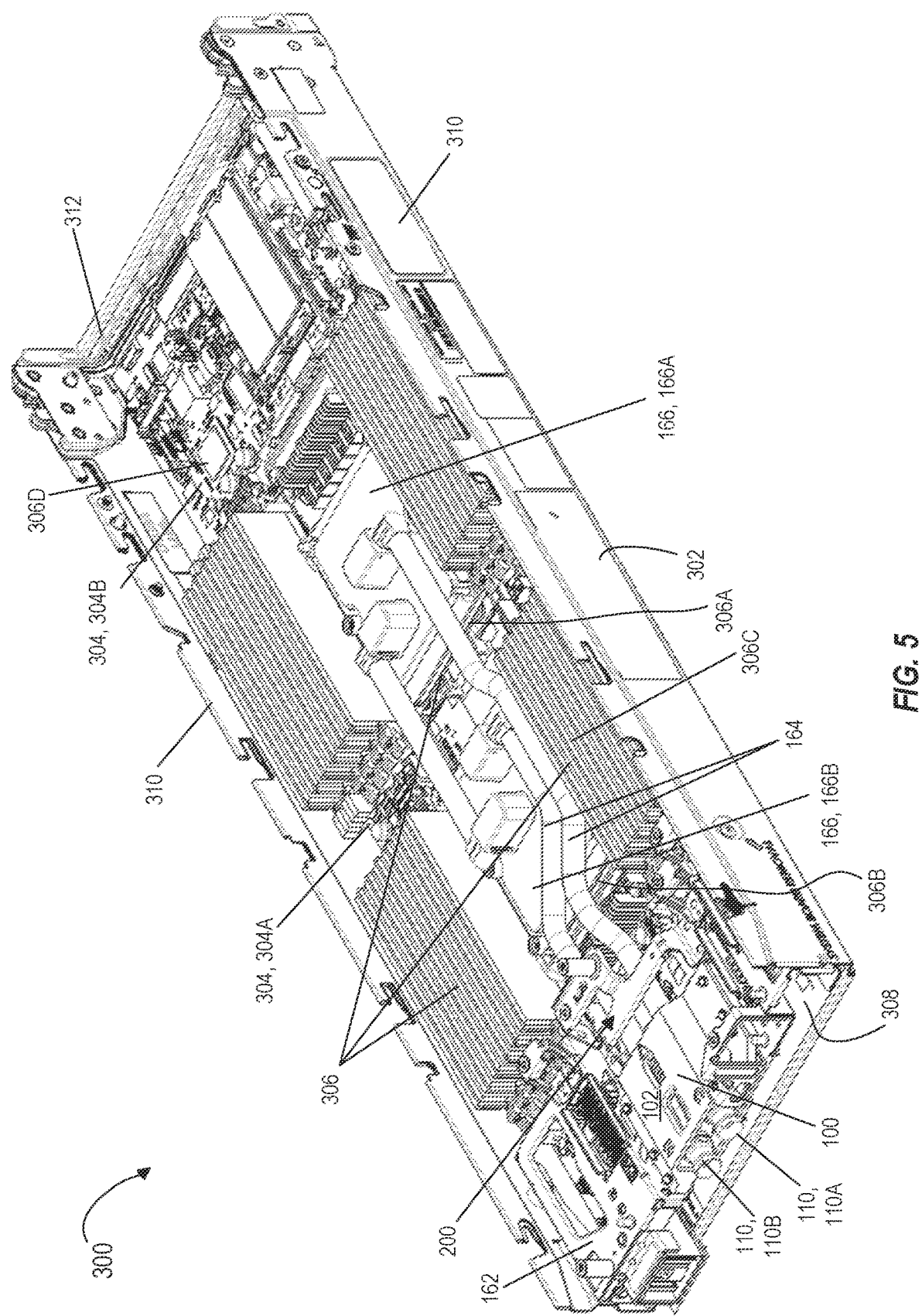
FIG. 5 illustrates a perspective view of a computing system having the liquid cooling assembly of FIG. 4 according to an example implementation of the present disclosure.

FIG. 5 depicts a perspective view of a computing system 300 having a liquid cooling assembly 200 of FIG. 4. In some examples, the computing system 300 may be a blade server, a rack server, and the like. In one or more examples, the computing system 300 has a chassis 302, a plurality of circuit boards 304, a power supply unit (not shown), a plurality of electronic components 306, and the liquid cooling assembly 200.

The chassis 302 may include a base 308, a plurality of peripheral walls 310, a front panel 312, a rear panel (not shown), and a top cover (not shown). Each of the plurality of circuit boards 304 may be disposed on and coupled to the base 308. The plurality of electronic components 306 is mounted on each of the plurality of circuit boards 304. For example, the plurality of electronic components 306, such as a first processing resource 306A, a second processing resource 306B, and a plurality of dual in-line memory modules (DIMMs) 306C may be mounted on a first circuit board 304A. Similarly, the plurality of electronic components 306, such as a controller 306D, and the like may be mounted on a second circuit board 304B.

As discussed, in the example of FIG. 4, the liquid cooling assembly 200 includes a liquid cooling interconnect module 100, a mezzanine frame 162, a fluid flow channel 164, and a plurality of cold plates 166. The liquid cooling assembly 200 may be disposed from a rear side of the computing system 300 such that the liquid cooling interconnect module 100 and the mezzanine frame 162 are located proximate to the rear panel. In one or more examples, the liquid cooling interconnect module 100 includes a housing 102, a pair of biasing members (shown in FIGS. 1B and 2), an interconnect block 106 (shown in FIGS. 1B and 2), a pair of first connectors 108 (shown in FIGS. 1B and 2), and a pair of second connectors 110. In some examples, the liquid cooling interconnect module 100 may be coupled to the mezzanine frame 162. The interconnect block 106 may be coupled to the pair of first and second connectors 108, 110. The fluid flow channel 164 extending over the plurality of cold plates 166 may be coupled to the pair of first connectors 108. For example, a first end of the fluid flow channel 164 may be coupled to a first connector 108A of the pair of first connectors 108, and a second end of the fluid flow channel 164 may be coupled to a second connector 108B of the pair of first connectors 108. Similarly, a supply line manifold (shown in FIG. 2) may be coupled to a first connector 110A of the pair of second connectors 110, and a return line manifold (shown in FIG. 2) may be coupled to a second connector 110B of the pair of second connectors 110. Further, the supply and return line manifolds may be coupled to a coolant distribution unit (shown in FIG. 2). The first cold plate 166A may be mounted on the first processing resource 306A such that first cold plate 166A and the first processing resource 306A are in thermal communication with one another. Similarly, the second cold plate 166B may be mounted on the second processing resource 306B such that second cold plate 166B and the second processing resource 306B are in thermal communication with one another. In such examples, the fluid flow channel 164 extends from the first connector 108A of the pair of first connectors 108 and loops back the second connector 108B of the pair of second connectors 108. The fluid flow channel 164 extends via the first and second cold plates 166A, 166B. In some examples, the computing system 300 may further include a plurality of fabric mezzanine cards (not shown) mounted on and coupled to the mezzanine frame 162.

During operation of the computing system 300, the first and second processing resources 306A, 306B may generate a lot of waste-heat, which may have to be dissipated from the computing system 300. As discussed in the example of FIGS. 1B, 2, 3, and 4, the liquid cooling assembly 200 may aid in dissipating the waste-heat away from the computing system 300. For example, as part of dissipating the waste-heat from the computing system 300, a pump of a coolant distribution unit may supply a liquid coolant to the computing system 300 via the supply line manifold. The liquid cooling interconnect module 100 disposed at the rear end of the computing system 300 may receive the liquid coolant. For example, the first connector 110A of the pair of second connectors 110 may receive the liquid coolant and direct the liquid coolant to the fluid flow channel 164 via a first connector of a pair of first connectors. The fluid flow channel 164 may direct the liquid coolant to the first and second cold plates 166A, 166B such that the liquid coolant absorbs the waste-heat from the first and second processing resources 306A, 306B, respectively, and generate a heated liquid coolant. The fluid flow channel 164 may then direct the heated liquid coolant to the liquid cooling interconnect module 100 via a second connector of the pair of first connectors. The liquid cooling interconnect module 100 may then direct the heated liquid coolant to the return line manifold via the second connector 110B of the pair of second connectors 110. The return line manifold may further return the heated liquid coolant to the coolant distribution unit. In some examples, the coolant distribution system may include one or more heat exchangers, which may be configured to remove the waste-heat from the heated liquid coolant and regenerate the liquid coolant. The process of supplying the liquid coolant and receiving the heated liquid coolant may continue, as discussed herein above.

FIG. 6A depicts an exploded perspective view of a liquid cooling interconnect module 400. FIG. 6B depicts an assembled perspective view of the liquid cooling interconnect module 400 of FIG. 6A. FIG. 6C depicts a bottom view of a housing 402 of the liquid cooling interconnect module 400 of FIGS. 6A and 6B. The liquid cooling interconnect module 400 includes a housing 402, a biasing member 404, an interconnect block 406, a first pair of connectors 408, and a second pair of connectors 410.

The housing 402 includes a first wall 412, a second wall 414, and a pair of peripheral walls 416 extending between the first and second walls 412, 414, respectively to define the box-shaped component. The first wall 412 and the second wall 414 are mutually opposite walls, for example, a top cover wall and a bottom cover wall, respectively. In the example of FIG. 6A, the bottom wall 414 has a slot 415. Further, the housing 402 includes a bore 418 defined in-between the pair of peripheral walls 416 and the first and second walls 412, 414, and extending between a first end 420 and a second end 422 of the housing 402. The housing 402 further includes an interlocking member 424, a support assembly 426 (shown in FIG. 6C), and a pair of flanges 428.

The interlocking member 424 is disposed on and coupled to the first wall 412 of the housing 402. In the example of FIG. 6A, the interlocking member 424 is a flat spring finger. In some examples, the flat spring finger 424 is in a form of a cantilever beam having a first end 424A and a second end 424B. In some examples, the first end 424A is a free end and the second end 424B is a fixed end. In one or more examples, the second end is coupled to the housing 402 via a couple of fastens 425. Further, a portion of the flat spring finger 424 protrudes outside the second end 414 of the housing 402. In such examples, the portion of the flat spring finger 424 or the first end 424A may include a protrusion 424C (shown in FIG. 7) extending inwards relative to the housing 402.

Referring to FIG. 6C, the support assembly 426 is used to support the biasing member 404. In some examples, the support assembly 426 includes a post 426A disposed in the bore 418 at an offset distance "$D_1$" from the first end 420 of the housing 402, and a guide pin 426B (clearly shown in FIG. 7) extending perpendicularly from the post 426A. In some examples, the post 426A is coupled to an inner surface of the first wall 412, and the guide pin 426B extends a longitudinal direction 10. In some examples, the guide pin 426B is configured to retain the biasing member 404 within the housing 402. Similarly, the post 426A is configured to block the movement of the biasing member 404 along the longitudinal direction 10 so as to allow the compression of the biasing member 404.

Referring back to FIGS. 6A and 6B, the pair of flanges 428 extends from the pair of peripheral walls 416 of the housing 402 along a lateral direction 30. In some examples, the pair of peripheral walls 416 and the pair of flanges 428 may be merged (or integrated) to one another to form a unitary flange component. Each flange of the pair of flanges 428 may have fastening mechanism, such as "C-shaped" clamp 431, which may be couple the liquid cooling interconnect module 400 to the support structure, for example, the mezzanine frame of the computing system.

In the example of FIGS. 6A and 6B, the biasing member 404 is a helical compression spring. In some other examples, the biasing member 404 may be diaphragm, and the like. The biasing member 404 may apply adequate pulling force on the pair of first connectors 408 and a fluid flow channel 164 (shown in FIG. 4) connected to the pair of first connectors 408, so as to secure those components to the housing 402 and also provide adequate plunging force so as to push the interconnect block 406 outside the housing 402, when the interconnect block 406 is not retained by the interlocking member 424 of the housing 402.

The interconnect block 406 has an outer profile/dimension, which may be substantially complementary to an inner profile/dimension of the housing 402 or to the dimension of the bore 418. In one or more examples, the interconnect block 406 includes a pair of through openings 432 extending along the longitudinal direction 10. In such examples, the pair of through openings 432 are positioned spaced apart from one another by a distance "$D_2$" along the lateral direction 30, and extends between a first end 434 and a second end 436 of the interconnect block 406. In some examples, the distance "$D_2$" may be substantially equal to a width of the post 426A or the biasing member 404, such that those components does not interfere with the pair of through openings 432. The interconnect block 406 further includes a depression 438 formed on a first wall 440 of the interconnect block 406. As discussed herein above, the first wall 440 and a second wall 442 of the interconnect block 406 are mutually opposite walls, for example, a top cover wall and a bottom cover wall, respectively. For example, the depression 438 is formed on a portion of the first wall 440 such that the depression extends from the second end 436 till an offset distance "$D_3$" from the first end 434 of the interconnect block 406. In some examples, a length the depression 438 may be substantially equal to a one fourth of a length of the interconnect block 406. In such examples, the depression 438 may end up having a lobe 438A at the offset distance "$D_3$" from the first end 434, which has a height that is substantially equal to a height of the depression 438. In some examples, each through opening 432 of the interconnect block 406 at the first end 434 may have a push fitting connector (not shown) and at the second end 436 may have a female screw threads 444.

In the example of FIG. 6A, the pair of first connectors 408 (or liquid couplings) includes a first connector 408A and a second connector 408B, where each of the first and second connectors 408A, 408B has a first end portion 446 and a second end portion 448. In such examples, each of the first and second end portions 446, 448 has a push connect feature 450, 452, respectively. As discussed hereinabove, the pair of second connectors 410 (or liquid couplings) includes a first connector 410A and a second connector 410B, where each of the first and second connectors 410A, 410B has a first end portion 454 and a second end portion 456. In such examples, the first end portion 454 has a push connect feature 458 and the second end portion 456 has male screw threads 460, for example.

In some examples, the plurality of components of the liquid cooling interconnect module 400, such as the housing 402, the interconnect block 406, the pair of first connectors 408, and the pair of second connectors 410 may be made of a polymer material. In some other examples, the plurality of components of the liquid cooling interconnect module 400 may be made of a metal, and the like.

The plurality of components of the liquid cooling interconnect module 400 may be easily and quickly assembled or disassembled without any tools. For example, each connector of the pair of first connectors 408 may be first coupled to a respective opening of the pair of through openings 432 at the first end 434 of the interconnect block 406. In particular, the second end portion 448 of the pair of first connectors 408 having the push connect feature 452 may be push-fitted to push connect feature at the first end 434 of the interconnect block 406. Similarly, each connector of the pair of second connectors 410 may be coupled to a respective opening of the pair of through openings 432 at the second end 436 of the interconnect block 406. In particular, the first end portion 456 of the pair of second connectors 410 having the male screw threads 460 may be screw-fitted to the female screw threads 444 at the second end 436 of the interconnect block 406.

Further, the biasing member 404 may be disposed within the bore 418 of the housing 402 such that the biasing member 404 is disposed along the guide pin 426B. In other words, the biasing member 404 passes over the guide pin 426B such that a first end (not labeled) of the biasing member 404 contacts the post 426A of the support assembly 426. Later, a fluid flow channel 164 (shown in FIG. 4) may be push fitted to the plurality of first connectors 408. For example, a first end 164A (shown in FIG. 4) of the fluid flow channel 164 may be push fitted to the first connector 408A of the pair of first connectors 408, and a second end 164B (shown in FIG. 4) of the fluid flow channel 164 may be push fitted to the second connector 408B of the pair of first connectors 408. Then, the fluid flow channel 164 having the first end 164A may be inserted into the bore 418 of the housing 402 via the slot 415, and the fluid flow channel 164 having the second end 164B may be inserted into the bore 418 of the housing via the slot 415. Further, the interconnect block 406 is then slidably inserted within the bore 418 of the housing 402 such that the first end 434 of the interconnect block 406 contacts a second end (not labeled) of the biasing member 404.

The interconnect block 406 is then pushed along the longitudinal direction 10, such that the biasing member 404 is compressed by the interconnect block 406 and the support assembly 426 of the housing 402, until the biasing member 404 reaches to a compressed position. In other words, the interconnect block 406 is configured to compress the biasing member 104 against the support assembly 426 to the compressed position when inserted into the bore 418 of the housing 402. Once the biasing member 404 reaches to the compressed position, the force applied to push the interconnect block 406 inside the housing 402 may be withdrawn. In such cases, the biasing member 404 may try to decompress, thereby moving the interconnect block 404 outside (backward) the housing 402. However, in such examples, the flat spring finger 424 may move inwards relative to the housing 402 to engage the protrusion 424C of the flat spring finger 424 with the lobe 438A of the depression 438 so as to directly retain the interconnect block 406 within the housing 402 when the biasing member 404 is still in the compressed position. In one or more examples, the flat spring finger 424 may move along the radially downwards direction 20 to interlock the backward movement of the interconnect block 406, and thereby retain the interconnect block 406 within the housing 402 and complete a tool-less method of assembling the liquid coolant interconnect module 400. In one or more examples, to disassemble the liquid coolant interconnect module 400, the flat spring finger 424 may be moved outwards relative to the housing 402 to disengage the protrusion 424C from the lobe 438 of the depression 438 so as to directly release the interconnect block 406 from the housing 402. In such examples, the flat spring finger 424 may move along the radially upwards direction 20 to allow the backward movement of the interconnect block 406, and thereby release the interconnect block 406 from the housing 402. It may be noted herein, when the protrusion 424C disengages from the lobe 438A, the biasing member 404 may completely decompress to slidably plunge the interconnect block 406 out of the housing 402.

FIG. 7 depicts a cross-sectional of the interconnect module 400 taken along line 7-7' in FIG. 6B. In the example of FIG. 7, while assembling the liquid cooling interconnect module 400, the flat spring finger 424 interlocks the interconnect block 406 when the biasing member 404 is in the compressed position, so as to restrict the backward movement of the interconnect block 406 by the biasing member 404, in order to push it out of the housing 402. In particular, the flat spring finger 424 moves inwards relative to the housing 402, to engage the protrusion 424C of the flat spring finger 424 with the lobe 438A of the depression 438 to directly retain the interconnect block 406 within the housing 402. In some examples, while disassembling the liquid cooling interconnect module 400, the flat spring finger 424 may be moved outwards relative to the housing 402, to disengage the protrusion 424C of the flat spring finger 424 from the lobe 438A of the depression 438 to directly release the interconnect block 406 from the housing 402. In such examples, when the lobe 438A is disengaged from the protrusion 424C, the biasing member 404 may decompress to slidably plunge the interconnect block 406 out of the housing 402. Thus, in accordance to one or more examples of the present disclosure, assembling and/or disassembling the liquid cooling interconnect module 400 may not require any tools and may be performed easily and quickly, thereby reducing the down time and users errors associated to such events. Further, the plurality of components of the liquid interconnect module 400, having relatively simple tool-less design(s) may enable bulk manufacturing and is economically viable.

It may be noted herein that the liquid cooling assembly 200 shown in the example of FIG. 4 may include the liquid cooling interconnect module 400 of FIG. 6B without deviating from the scope of the present disclosure. In such examples, the mezzanine frame 162 of the liquid cooling assembly 200 may be coupled to the housing 402 of the liquid cooling interconnect module 400. In one or more examples of the present disclosure, the liquid cooling assembly 200 having the liquid cooling interconnect module 400 may be provided as a "one stop liquid cooling solution kit" to customers to easily install and/or quickly replace an air cooling assembly of the computing system with the one stop liquid cooling solution kit. Further, it may be noted herein that the computing system 300 shown in the example of FIG. 5 may include the liquid cooling assembly 200 of FIG. 4 having the liquid cooling interconnect module 400 of FIG. 6B without deviating from the scope of the present disclosure.

FIG. 8A depicts an exploded perspective view of a liquid cooling interconnect module 500. FIG. 8B illustrates an assembled perspective view of the liquid cooling interconnect module 500 of FIG. 8A. The liquid cooling interconnect module 500 includes a housing 502, a biasing member 504, an interconnect block 506, a first pair of connectors 508, and a second pair of connectors 510.

The housing 502 includes a first wall 512, a second wall 514, and a pair of peripheral walls 516 extending between the first and second walls 512, 514, respectively to define the box-shaped component. The first wall 512 and the second wall 514 are mutually opposite walls, for example, a top cover wall and a bottom cover wall, respectively. The housing 502 includes a bore 518 defined in-between the pair of peripheral walls 516 and the first and second walls 512, 514, and extending between a first end 520 and a second end 522 of the housing 502. The housing 502 further includes a pair of key shafts 515 disposed on respective inner surface of first and second walls 512, 514, located at a center of the second end 522, and extending longitudinally towards the first end 520. The pair of key shafts 515 is configured to block the movement of the interconnect member 506 outside the second end 522 of the housing 502 when the interconnect member 506 is slidably inserted in the bore 518 from the first side 520 of the housing 502.

In the example of FIGS. 8A and 8B, the housing 502 includes an interlocking member 524, a support assembly 526, and a pair of flanges 528. In some examples, the interlocking member 524 and the support assembly 526 are integrated to one another to form an interlocking support assembly 527. In such examples, the interlocking support assembly 527 includes a shoulder stud 529 and an attachment block 531. In some examples, the shoulder stud 529 has a shoulder portion 529A, a first shaft portion 529B, and a second shaft portion 529C. The shoulder stud 529A has a diameter greater than a diameter of the first shaft portion 529B, and the diameter of the first shaft portion 529B is greater that a diameter of the second shaft portion 529C. The attachment block 531 has a body 533 and a pair of shoulders 535 coupled to the body 533. In such examples, the body 533 has a pair of apertures 537 and a through-hole 539 disposed there between the pair of apertures 535. Further, each shoulder 535 of the pair of shoulders 535 has a protrusion 541. The pair of flanges 528 extends from the pair of peripheral walls 516 of the housing 502 along a lateral direction 30. In some examples, the pair of peripheral walls 516 and the pair of flanges 528 may be merged (or integrated) to one another to form a unitary flange component. Each flange of the pair of flanges 528 may have through-holes 531 to allow coupling of the liquid cooling interconnect module 500 to a support structure, for example, a mezzanine frame of the computing system. In the example of FIGS. 8A and 86, each flange of the pair of flanges 528 has a different width to adapt to a size of the support structure of the computing system. Further, the pair of flanges 528 of the housing 502 includes a pair of notches 543 (shown in FIG. 9A).

In the example of FIGS. 8A and 8B, the biasing member 504 is a helical compression spring. In some other examples, the biasing member 504 may be diaphragm, and the like.

The biasing member 504 may apply adequate pulling force on the pair of first connectors 508 and a fluid flow channel 164 (shown in FIG. 4) connected to the pair of first connectors 508, so as to indirectly secure those components to the housing 502 via the attachment block 531 and also provide adequate plunging force so as to indirectly push the interconnect block 506 outside the housing 502, when the interconnect block 506 is not retained by the attachment block 531.

The interconnect block 506 has an outer profile/dimension, which may be substantially complementary to an inner profile/dimension of the housing 502 or to the dimension of the bore 518. In one or more examples, the interconnect block 506 includes a pair of through openings 532 extending along the longitudinal direction 10. As discussed hereinabove in the examples of FIGS. 1A and 6A, the pair of through openings 532 are positioned spaced apart from one another, and extends between a first end 534 and a second end 536 of the interconnect block 506. The interconnect block 506 has a hole 547 (shown in FIG. 9B) at the second end 536. Further, the interconnect block 506 includes a depression 538 formed on a first wall 540 of the interconnect block 506. As discussed herein above, the first wall 540 is a top cover wall. As discussed in the example of FIG. 6A, the depression 538 is formed on a portion of the first wall 540 such that the depression 538 extends from the second end 536 till an offset distance from the first end 534 of the interconnect block 506. In some examples, a length the depression 538 may be substantially equal to a one half of a length of the interconnect block 506. In such examples, the depression 538 may end up having a lobe 538A at the offset distance from the first end 534, which has a height that is substantially equal to a height of the depression 538. In some examples, each through opening 532 of the interconnect block 506 at the first end 534 may have a push fitting connector (not shown) and at the second end 536 may have a female screw threads 544.

In the example of FIG. 8A, the pair of first connectors 508 (or liquid couplings) includes a first connector 508A and a second connector 5088, where each of the first and second connectors 508A, 508B has a first end portion 546 and a second end portion 548. In such examples, each of the first and second end portions 546, 548 has a push connect feature 550, 552, respectively. As discussed hereinabove, the pair of second connectors 510 (or liquid couplings) includes a first connector 510A and a second connector 510B, where each of the first and second connectors 510A, 510B has a first end portion 554 and a second end portion 556. In such examples, the first end portion 554 has a push connect feature 558 and the second end portion 556 has male screw threads 560, for example.

FIG. 9A depicts a cross-sectional view of the interconnect module taken along line 9A-9A' in FIG. 8B. FIG. 9B depicts a cross-sectional view of the interconnect module taken along line 9B-9B' in FIG. 8B.

In one or more examples, the plurality of components of the liquid cooling interconnect module 500 may be easily and quickly assembled or disassembled without any tools. For example, each connector of the pair of first connectors 508 may be first coupled to a respective opening of the pair of through openings 532 at the first end 534 of the interconnect block 506. In particular, the second end portion 548 of the pair of first connectors 508 having the push connect feature 552 may be push-fitted to push connect feature at the first end 534 of the interconnect block 506. Similarly, each connector of the pair of second connectors 510 may be coupled to a respective opening of the pair of through openings 532 at the second end 536 of the interconnect block 506. In particular, the first end portion 556 of the pair of second connectors 510 having the male screw threads 560 may be screw-fitted to the female screw threads 544 at the second end 536 of the interconnect block 506.

The interconnect block 506 is slidably inserted into the bore 518 via the first end 520 of the housing 502. In such examples, interconnect block 506 may be pushed until, the lobe 538A of each depression 538 in the interconnect block 506 gets engaged with the lobe 515A of the corresponding key shaft 515 of the housing 502. Thus, the lobes 515A and 538A arrests further movement of the interconnect block 506, thereby holding the interconnect block 506 within the housing 502. Later, the biasing member 504 may be disposed within the bore 518 via the first end 520 of the housing 502 such that a first end (not labeled) of the biasing member 504 is located around the hole 547 and is in contact with the first end 534 of the interconnect block 506. Further, the attachment block 531 is inserted inside into the bore 518 unit a second end (not labeled) of the biasing member 504 is in contact with the body 533 of the attachment block 531. In such examples, the pair of first connectors 508 passes through the pair of apertures 537 (shown in FIG. 8A) of the body 533. In particular, the first end portion 546 and the second end portion 548 (shown in FIG. 8A) of the pair of first connectors 508 passes through the pair of apertures 537.

Later, the stud shoulder 529 is inserted into the bore 518 such that it passes through the through-hole 539 formed in the body 533 and the biasing member 504, and is coupled to the interconnect block 506. For example, the shoulder portion 529A of the stud shoulder 529 is held outside of the body 533, the first shaft portion 529A passes through the body 533 and the biasing member 504, and the second shaft portion 529C is inserted and coupled to the hole 547 of the interconnect block 506. Thus, the biasing member 504 is disposed contacting the attachment block 531 and the interconnect block 506. In one or more examples, the stud shoulder 529 is pushed along the longitudinal direction 10, such that the biasing member 504 is compressed by the interconnect block 506 and the attachment block 531, until the biasing member 504 reaches to a compressed position. Once the biasing member 504 reaches to the compressed position, the force applied to push the interconnect block 506 inside the housing 502 may be withdrawn. In such cases, the biasing member 504 may try to decompress, thereby moving the interconnect block 504 outside (backward) the housing 502. Now referring to FIG. 98, however in such examples, each protrusion 541 may move outwards relative to the housing 502 to engage each protrusion 541 with the notch 543 of a corresponding shoulder 535 so as to indirectly retain the interconnect block 506 within the housing 502 via the attachment block 531 when the biasing member 504 is still in the compressed position. In other words, each protrusion of the pair of protrusions 541 gets engaged with a corresponding notch of the pair of notches 543 to interlock the interconnect block 506 within the housing 502. In one or more examples, each shoulder 535 may be moved outwardly along the lateral direction 30 to interlock the backward movement of the interconnect block 506, and thereby retain the interconnect block 506 within the housing 502 and complete a tool-less method of assembling the liquid coolant interconnect module 500. In one or more examples, to disassemble the liquid coolant interconnect module 500, one handle 545 of each shoulder 535 may be moved inwards relative to the housing 502 to disengage the protrusion 541 from the corresponding notch 543 so as to indirectly release the interconnect block 506 from the housing 502 via the attachment block 531. In such examples, each handle 545 may be moved inwardly along the lateral direction 20 to allow the backward movement of the interconnect block 506 via the attachment block 531, and thereby release the interconnect block 506 from the housing 502. Thus, in accordance to one or more examples of the present disclosure, assembling and/or disassembling the liquid cooling interconnect module 500 may not require any tools and may be performed easily and quickly, thereby reducing the down time and users errors associated to such events. Further, the plurality of components of the liquid interconnect module 500, having relatively simple tool-less design(s) may enable bulk manufacturing and is economically viable.

It may be noted herein that the liquid cooling assembly 200 shown in the example of FIG. 4 may include the liquid cooling interconnect module 500 of FIG. 8B without deviating from the scope of the present disclosure. In such examples, the mezzanine frame 162 of the liquid cooling assembly 200 may be coupled to the housing 502 of the liquid cooling interconnect module 500. In one or more examples, the liquid cooling assembly 200 having the liquid cooling interconnect module 500 may be provided as a "one stop liquid cooling solution kit" to customers to easily install and/or quickly replace an air cooling assembly of the computing system with the one stop liquid cooling solution kit. Further, it may be noted herein that the computing system 300 shown in the example of FIG. 5 may include the liquid cooling assembly 200 of FIG. 4 having the liquid cooling interconnect module 500 of FIG. 8B without deviating from the scope of the present disclosure.

FIG. 10 is a flow diagram a flowchart depicting a method 1000 of assembling a liquid cooling interconnect module. It should be noted herein that the method 1000 is described in conjunction with FIGS. 1A, 1B, 2, 6A, 6B, 6C, 8A, and 8B for example.

The method 1000 starts at block 1002 and continues to block 1004. At block 1004, the method 1000 includes coupling a pair of first connectors to an interconnect block. For example, the pair of first connectors is coupled to a pair of through openings located at a first end of the interconnect block, as described in FIGS. 1A, 1B, 2, 6A, 6B, 6C, 8A, and 8B. In some examples, prior to the step of coupling the pair of first connectors to the pair of through openings, the method may include the step of inserting a fluid flow channel extending via a plurality of cold plates, through a bore of a housing. For example, a first end and a second end of the fluid flow channel are inserted through the bore. Later, the first and second ends of the fluid flow channel is coupled the pair of first connectors. In such examples, the step of coupling the fluid flow channel to the pair of first connectors includes coupling a first connector of the pair of first connectors to the first end of the fluid flow channel, and a second connector of the pair of first connectors to the second end of the fluid flow channel.

The method 1000 continues to block 1006. At block 1006, the method 1000 includes coupling a pair of second connectors to the interconnect block. For example, the pair of second connectors is coupled to the pair of through openings located at a second end of the interconnect block, as described in FIGS. 1A, 1B, 2, 6A, 6B, 6C, 8A, and 8B. The method 1000 continues to block 1008. At block 1008, the method 1000 includes disposing a biasing member within the bore of the housing, such that a first end of each biasing member contacts a support assembly of the housing, as described in FIGS. 1A, 1B, 2, 6A, 6B, 6C, 8A, and 8B.

The method 1000 continues to block 1010. At block 1010, the method 1000 includes a step of slidably inserting the interconnect block within the bore of the housing such that the interconnect block compresses the biasing members against the support assembly to a compressed position. In such examples, the method 1000 further includes a step of retaining the interconnect block with in the housing. For example, the housing includes a pair of interlocking members, such as a pair of detents, which may move inwards relative to the housing, for engaging a protrusion of each detent with a lobe of a corresponding depression formed in the interconnect block, so as to directly retain the interconnect block within the housing when the biasing member is in the compressed position.

The method 1000 may further include a first sub-step of coupling the assembled liquid cooling interconnect module to a mezzanine frame of the computing system. Further, the method 1000 may further include a second sub-step of mounting each of the plurality of cold plates on a corresponding processing resource of a plurality of processing resources of the computing system. The method 1000 may further include a third sub-step of coupling a first connector of the pair of second connectors to a supply line manifold of a coolant distribution unit, and a second connector of the pair of second connectors to a return line manifold of the coolant distribution unit.

In some examples, the method 1000 may also include a step of disassembling the liquid cooling interconnect module. For example, for disassembling the liquid cooling interconnect module, each detent of the pair of detents may move outwards relative to the housing, for disengaging the protrusion from the lobe to indirectly release the interconnect block from the housing via the attachment block. In such examples, upon disengagement of the lobe from the protrusion, the biasing member may decompress to slidably plunge the interconnect block out of the housing. The fluid flow channel may be disassembled first. Later, the pair of first and second pair of connectors may be disassembled to separate those component from the interconnect block. The method 1000 ends at block 1012.

Various features as illustrated in the examples described herein may be implemented as a tool-less method of quickly and easily assembling/disassembling a liquid cooling interconnect module by a technician or a customer. Thus, reducing the down time of the computing system and users errors associated to such events of assembling and disassembling the interconnect module. Further, the liquid cooling interconnect module may be part of a liquid cooling assembly, which may be provided as a "one stop liquid cooling solution kit" to customers to easily install and/or quickly replace an air cooling assembly of the computing system with the one stop liquid cooling solution kit.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A liquid cooling interconnect module for a liquid cooling assembly of a computing system, comprising:
   a housing having a bore extending between a first end and a second end of the housing, wherein the housing comprises an interlocking member and a support assembly;
   a biasing member disposed within the housing contacting the support assembly;
   an interconnect block having a pair of through openings and configured to be slidably inserted within the bore of the housing contacting the biasing member, wherein the interconnect block is configured to compress the biasing member against the support assembly to a compressed position when inserted into the bore of the housing, and wherein the interlocking member is configured to retain the interconnect block within the housing when the biasing member is in the compressed position; and
   a pair of first connectors coupled to a first end of the pair of through openings, and a fluid flow channel of the liquid cooling assembly, wherein a first connector of the pair of first connectors is coupled to a first end of the fluid flow channel and a second connector of the pair of first connectors is coupled to a second end of the fluid flow channel, and wherein the fluid flow channel extends via a plurality of cold plates of the liquid cooling assembly.

2. The liquid cooling interconnect module of claim 1, wherein the support assembly comprises a post disposed in the bore at an offset distance from the first end of the housing, and a guide pin extending from the post, and wherein the biasing member is disposed along the guide pin contacting the post and the interconnect block.

3. The liquid cooling interconnect module of claim 2, wherein the interlocking member comprises a pair of detents formed on a first wall and a second wall of the housing, wherein the interconnect block has a pair of depressions formed on a first wall and a second wall of the interconnect block, and wherein the first and second walls of each of the housing and the interconnect block are mutually opposite walls.

4. The liquid cooling interconnect module of claim 3, wherein each detent of the pair of detents is configured to move inwards relative to the housing for engaging a protrusion of each detent with a lobe of a corresponding depression of the pair of depressions to directly retain the interconnect block within the housing, and wherein each detent of the pair of detents is configured to move outwards relative to the housing for disengaging each protrusion from the lobe of the corresponding depression to directly release the interconnect block from the housing.

5. The liquid cooling interconnect module of claim 2, wherein the interlocking member comprises a flat spring finger disposed on and coupled to a wall of the housing, wherein the flat spring finger protrudes outside the second end of the housing, and wherein the interconnect block has a depression formed on a wall of the interconnect block.

6. The liquid cooling interconnect module of claim 5, wherein the flat spring finger is configured to move inwards relative to the housing for engaging a protrusion of the flat spring finger with a lobe of the depression to directly retain the interconnect block in the housing, and wherein the flat spring finger is configured to move outwards relative to the housing for disengaging the protrusion from the lobe to directly release the interconnect block from the housing.

7. The liquid cooling interconnect module of claim 1, wherein the support assembly and the interlocking member are integrated to one another to form an interlocking support assembly, wherein the interlocking support assembly comprises a shoulder stud, and an attachment block comprising a body having a through-hole, and a pair of shoulders having a pair of protrusions, coupled to the body, wherein the interconnect block has a hole, wherein the biasing member is disposed contacting the attachment block and the interconnect block, wherein the shoulder stud extends along the through-hole and the biasing member, and coupled to the hole, and wherein a pair of peripheral walls of the housing comprises a pair of notches.

8. The liquid cooling interconnect module of claim 7, wherein each shoulder of the pair of shoulders is configured to move outwards relative to the housing for engaging each protrusion with a corresponding notch to indirectly retain the interconnect block within the housing via the attachment block, and wherein each shoulder of the pair of shoulders is configured to move inwards relative to the housing for disengaging each protrusion from the corresponding notch to indirectly release the interconnect block from the housing via the attachment block.

9. The liquid cooling interconnect module of claim 1, further comprising a pair of second connectors coupled to a second end of the pair of through openings, and wherein a first connector of the pair of second connectors is coupled to a supply line manifold of a coolant distribution unit, and a second connector of the pair of second connectors is coupled to a return line manifold of the coolant distribution unit.

10. A liquid cooling assembly of a computing system, comprising:
   a plurality of cold plates;
   a fluid flow channel extending via the plurality of cold plates;
   a liquid cooling interconnect module comprising:
      a housing having a bore extending between a first end and a second end of the housing, wherein the housing comprises an interlocking member and a support assembly;
      a biasing member disposed within the housing contacting the support assembly;
      an interconnect block having a pair of through openings and configured to be slidably inserted within the bore of the housing contacting the biasing member, wherein the interconnect block is configured to compress the biasing member against the support assembly to compress the biasing member to a compressed position when inserted into the bore of the housing, and wherein the interlocking member is configured to retain the interconnect block within the housing when the biasing member is in the compressed position; and
      a pair of first connectors coupled to a first end of the pair of through openings, and the fluid flow channel, wherein a first connector of the pair of first connectors is coupled to a first end of the fluid flow channel, and a second connector of the pair of first connectors is coupled to a second end of the fluid flow channel; and
   a mezzanine frame coupled to the housing.

11. The liquid cooling assembly of claim 10, wherein the support assembly comprises a post disposed in the bore at an offset distance from the first end of the housing, and a guide pin extending from the post, and wherein the biasing member is disposed along the guide pin contacting the post and the interconnect block.

12. The liquid cooling assembly of claim 11, wherein the interlocking member comprises a pair of detents formed on a first wall and a second wall of the housing, wherein the interconnect block has a pair of depressions formed on a first wall and a second wall of the interconnect block, and wherein the first and second walls of each of the housing and the interconnect block are mutually opposite walls.

13. The liquid cooling assembly of claim 12, wherein each detent of the pair of detents is configured to move inwards relative to the housing for engaging a protrusion of each detent with a lobe of a corresponding depression of the pair of depressions to directly retain the interconnect block within the housing, and wherein each detent of the pair of detents is configured to move outwards relative to the housing for disengaging each protrusion from the lobe of the corresponding depression to directly release the interconnect block from the housing.

14. The liquid cooling assembly of claim 11, wherein the interlocking member comprises a flat spring disposed on and coupled to a wall of the housing, wherein the flat spring protrudes outside the second end of the housing, and wherein the interconnect block has a depression formed on a wall of the interconnect block.

15. The liquid cooling assembly of claim 14, wherein the flat spring is configured to move inwards relative to the housing for engaging a protrusion of the flat spring with a lobe of the depression to directly retain the interconnect block in the housing, and wherein the flat spring is configured to move outwards relative to the housing for disengaging the protrusion from the lobe to directly release the interconnect block from the housing.

16. The liquid cooling assembly of claim 10, wherein the support assembly and the interlocking member are integrated to one another to form an interlocking support assembly, wherein the interlocking support assembly comprises a shoulder stud, and an attachment block comprising a body having a through-hole, and a pair of shoulders having a pair of protrusions, coupled to the body, wherein the interconnect block has a hole, wherein the biasing member is disposed contacting the attachment block and the interconnect block, wherein the shoulder stud extends along the through-hole and the biasing member, and coupled to the hole, and wherein a pair of peripheral walls of the housing comprises a pair of notches.

17. The liquid cooling assembly of claim 16, wherein each shoulder of the pair of shoulders is configured to move outwards relative to the housing for engaging each protrusion with a corresponding notch to indirectly retain the interconnect block within the housing via the attachment block, and wherein each shoulder of the pair of shoulders is configured to move inwards relative to the housing for disengaging each protrusion from the corresponding notch to indirectly release the interconnect block from the housing via the attachment block.

18. A method of assembling a liquid cooling interconnect module of a liquid cooling assembly for a computing system, comprising:
   coupling a pair of first connectors to a first end of a pair of through openings of an interconnect block, wherein a first connector of the pair of first connectors is further coupled to the first end of a fluid flow channel and a second connector of the pair of first connectors is further coupled to the second end of the fluid flow channel, and wherein the fluid flow channel extends via a plurality of cold plates of the liquid cooling assembly;
   coupling a pair of second connectors to a second end of the pair of through openings;
   disposing a biasing member within a housing contacting a support assembly; and
   slidably inserting the interconnect block within a bore of the housing such that the interconnect block compresses the biasing member against the support assembly to a compressed position, and an interlocking member of the housing, retains the interconnect block within the housing when the biasing member is in the compressed position.

* * * * *